(12) United States Patent
Kariyada et al.

(10) Patent No.: US 12,022,742 B2
(45) Date of Patent: Jun. 25, 2024

(54) MAGNETIC TUNNEL JUNCTION ELEMENT AND SEMICONDUCTOR DEVICE

(71) Applicant: SONY SEMICONDUCTOR SOLUTIONS CORPORATION, Kanagawa (JP)

(72) Inventors: Eiji Kariyada, Kumamoto (JP); Hironobu Tanigawa, Kumamoto (JP); Tetsuhiro Suzuki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 760 days.

(21) Appl. No.: 17/252,775

(22) PCT Filed: Jun. 17, 2019

(86) PCT No.: PCT/JP2019/023979
§ 371 (c)(1),
(2) Date: Dec. 16, 2020

(87) PCT Pub. No.: WO2020/008853
PCT Pub. Date: Jan. 9, 2020

(65) Prior Publication Data
US 2021/0257541 A1    Aug. 19, 2021

(30) Foreign Application Priority Data
Jul. 4, 2018    (JP) .................. 2018-127722

(51) Int. Cl.
H10N 50/80    (2023.01)
H10B 61/00    (2023.01)
H10N 50/85    (2023.01)

(52) U.S. Cl.
CPC ............. *H10N 50/80* (2023.02); *H10B 61/00* (2023.02); *H10N 50/85* (2023.02)

(58) Field of Classification Search
CPC ........ H10N 50/80; H10N 50/85; H10N 50/10; H10B 61/00
See application file for complete search history.

(56) References Cited

U.S. PATENT DOCUMENTS

| | | |
|---|---|---|
| 9,337,415 B1 | 5/2016 | Oh et al. |
| 2012/0068698 A1* | 3/2012 | Chen .................... G01R 33/098 324/252 |

(Continued)

FOREIGN PATENT DOCUMENTS

| | | |
|---|---|---|
| JP | 2007288196 A | 11/2007 |
| JP | 5051538 B2 | 10/2012 |

(Continued)

OTHER PUBLICATIONS

International Search Report prepared by the Japan Patent Office dated Aug. 19, 2019, for International Application No. PCT/JP2019/023979.

*Primary Examiner* — Sitaramarao S Yechuri
(74) *Attorney, Agent, or Firm* — SHERIDAN ROSS P.C.

(57) ABSTRACT

Provided is a magnetic tunnel junction element including: a magnetization pinned layer having a fixed magnetization direction; a first insulating layer which is provided on the magnetization pinned layer and is formed of an insulating material; a magnetization free layer provided on the first insulating layer; an adjacent layer which is provided adjacent to the magnetization free layer and is formed of a non-magnetic transition metal; and a cap layer which is formed to have a multilayer structure including at least one barrier layer formed of a non-magnetic transition metal and is provided on the adjacent layer.

20 Claims, 43 Drawing Sheets

(56) References Cited

U.S. PATENT DOCUMENTS

| | | |
|---|---|---|
| 2012/0287696 A1 | 11/2012 | Ohmori et al. |
| 2013/0163314 A1 | 6/2013 | Yamane et al. |
| 2014/0346626 A1 | 11/2014 | Yamane et al. |
| 2015/0028440 A1 | 1/2015 | Liu et al. |
| 2015/0235688 A1 | 8/2015 | Yamane et al. |
| 2015/0325782 A1* | 11/2015 | Ohmori ................ H10N 50/10 257/421 |
| 2017/0125481 A1 | 5/2017 | Kan |
| 2018/0226113 A1 | 8/2018 | Yamane et al. |

FOREIGN PATENT DOCUMENTS

| | | |
|---|---|---|
| JP | 2012-238631 | 12/2012 |
| JP | 2013-115413 | 6/2013 |
| JP | 2016-178301 | 10/2016 |
| TW | 201246209 A | 11/2012 |
| TW | 201721645 A | 6/2017 |
| WO | WO 2006/129725 | 12/2006 |
| WO | WO-2017086481 A1 | 5/2017 |

* cited by examiner

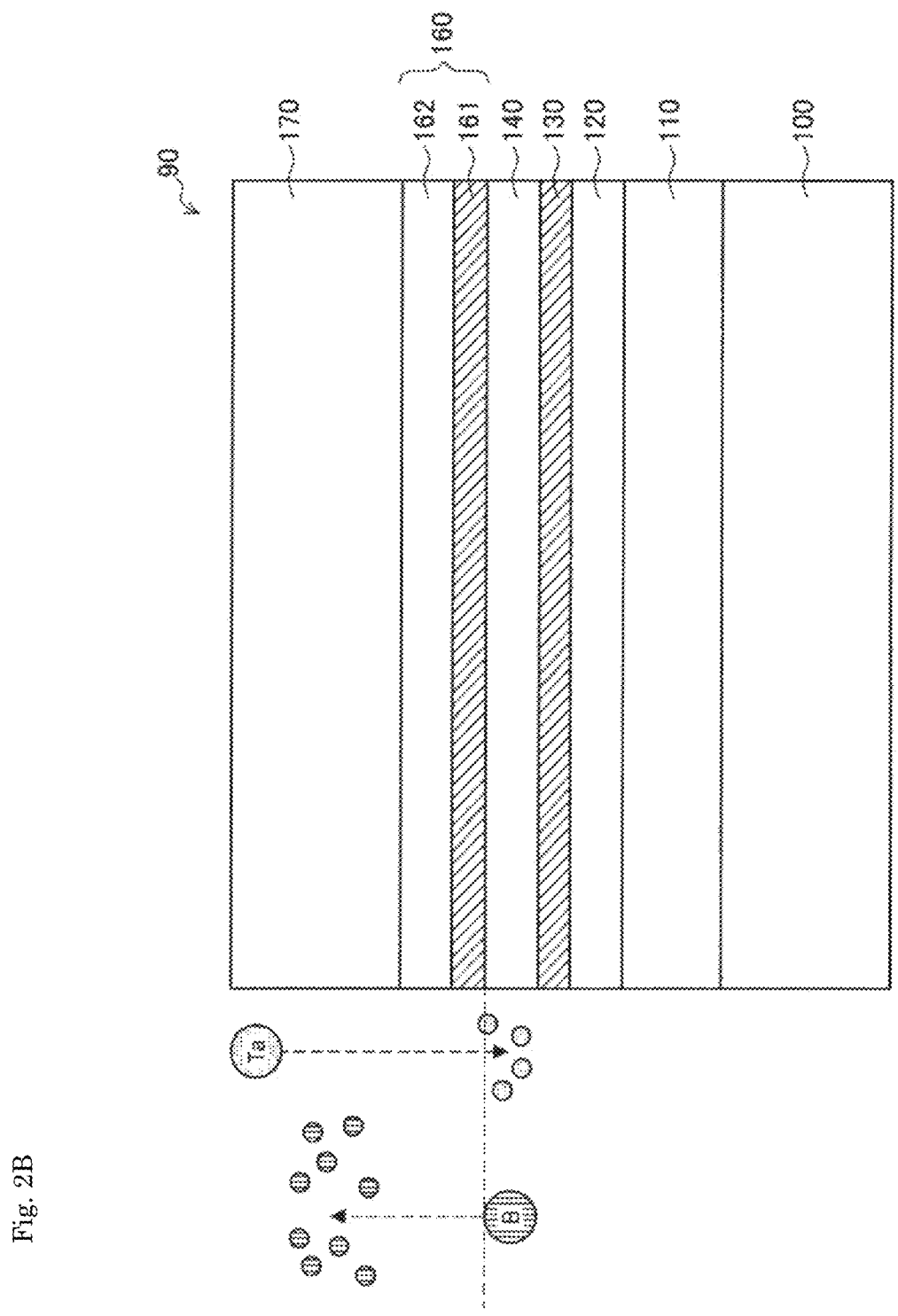

MAGNETIC TUNNEL JUNCTION ELEMENT AND SEMICONDUCTOR DEVICE

CROSS REFERENCE TO RELATED APPLICATIONS

This application is a national stage application under 35 U.S.C. 371 and claims the benefit of PCT Application No. PCT/JP2019/023979 having an international filing date of 17 Jun. 2019, which designated the United States, which PCT application claimed the benefit of Japanese Patent Application No. 2018-127722, filed 4 Jul. 2018, the entire disclosures of each of which are incorporated herein by reference.

Technical Field

The present disclosure relates to a magnetic tunnel junction element and a semiconductor device.

Background Art

In recent years, in a semiconductor device, it has become common to consolidate a large-capacity non-volatile memory in a logic circuit using a CMOS (Complementary MOS).

For example, an SRAM (Static Random Access Memory) or the like is consolidated in a logic circuit. On the other hand, in order to reduce costs and power consumption of a semiconductor device, replacing an SRAM with a magnetoresistive random access memory (MRAM) is being considered.

A magnetoresistive random access memory (MRAM) is a memory element using a magnetic tunnel junction (MTJ) element in which an insulating thin film is sandwiched between a pair of ferromagnetic layers. In an MTJ element, a magnitude of tunnel resistance changes depending on a relative magnetization direction between the pair of ferromagnetic layers. Thus, an MTJ element can store information by controlling the magnetization direction between the pair of ferromagnetic layers to be either parallel or antiparallel.

For example, the following PTL 1 below discloses an interfacial perpendicular magnetization type STT-MRAM (Spin Transfer Torque MRAM) using an MTJ element. PTL 1 discloses that thermal resistance of the MTJ element is improved to the extent that it can withstand a heat load in a wiring forming process, thereby simultaneously building the STT-MRAM and a peripheral circuit including a selection transistor and the like.

CITATION LIST

Patent Literature

[PTL 1]
JP 2013-187305 A

SUMMARY

Technical Problem

However, as structures and manufacturing processes of a semiconductor device become more complicated, an MTJ element that can be consolidated together with a logic circuit and the like is required to have better thermal resistance. For that reason, in the technique disclosed in PTL 1, it has been difficult to realize an MTJ element having sufficient heat resistance.

Therefore, the present disclosure proposes a magnetic tunnel junction element having higher thermal resistance and a semiconductor device equipped with the magnetic tunnel junction element.

Solution to Problem

According to the present disclosure, provided is a magnetic tunnel junction element including: a magnetization pinned layer having a fixed magnetization direction; a first insulating layer which is provided on the magnetization pinned layer and is formed of an insulating material; a magnetization free layer provided on the first insulating layer; an adjacent layer which is provided adjacent to the magnetization free layer and is formed of a non-magnetic transition metal; and a cap layer which is formed to have a multilayer structure including at least one barrier layer formed of the non-magnetic transition metal and is provided on the adjacent layer.

Also, according to the present disclosure, provided is a semiconductor device including a magnetic tunnel junction element, in which the magnetic tunnel junction element includes: a magnetization pinned layer having a fixed magnetization direction; a first insulating layer which is provided on the magnetization pinned layer and is formed of an insulating material; a magnetization free layer provided on the first insulating layer; an adjacent layer which is provided adjacent to the magnetization free layer and is formed of a non-magnetic transition metal; and a cap layer which is formed to have a multilayer structure including at least one barrier layer formed of the non-magnetic transition metal and is provided on the adjacent layer.

According to the present disclosure, by inhibiting diffusion of metal atoms from an upper electrode and diffusion of atoms from the magnetization free layer, which occur due to heat treatment at a high temperature for a long time, deterioration of perpendicular magnetic anisotropy of the magnetization free layer can be inhibited.

Advantageous Effects of Invention

As described above, according to the present disclosure, it is possible to provide a magnetic tunnel junction element having higher thermal resistance and a semiconductor device equipped with the magnetic tunnel junction element.

Also, the above effects are not necessarily intended as limiting and, in addition to or in place of the above effects, any one of the effects presented herein or any other effects that can be ascertained from the present specification may be achieved.

BRIEF DESCRIPTION OF DRAWINGS

FIG. 2B is a vertical cross-sectional view schematically showing a state of atom diffusion when a magnetic tunnel junction element according to a comparative example is heat-treated.

DESCRIPTION OF EMBODIMENTS

Figure 1:
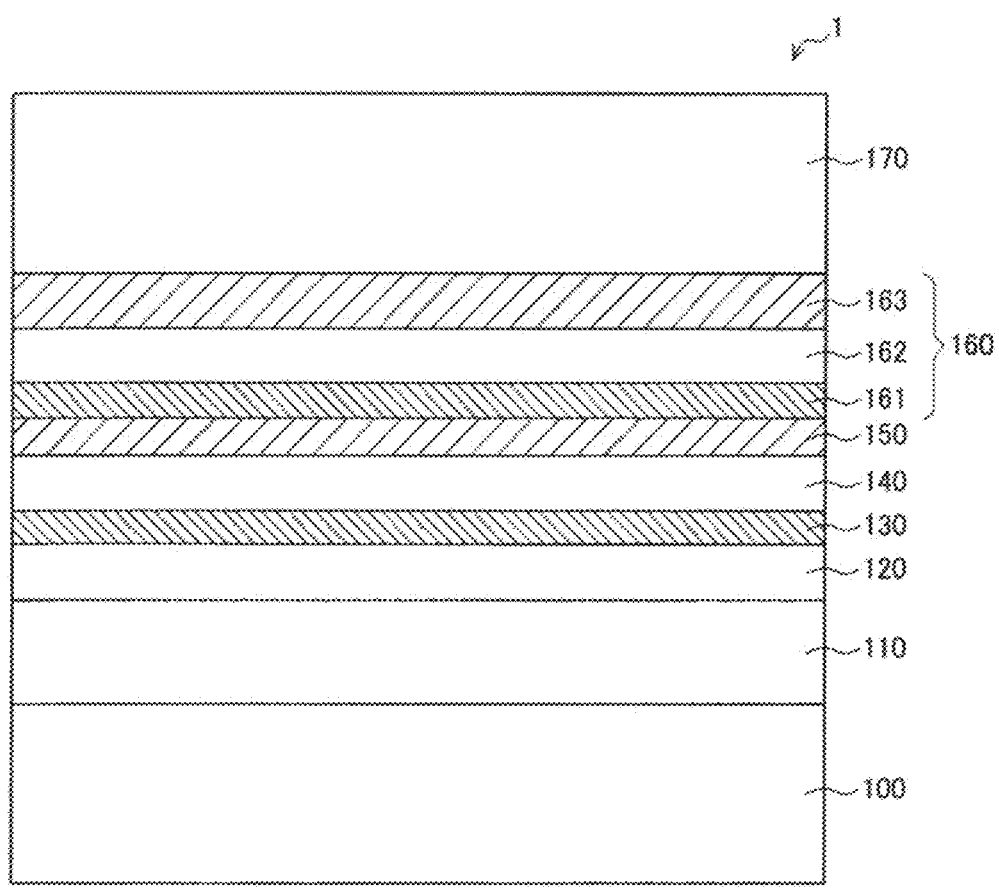
FIG. 1 is a vertical cross-sectional view schematically showing a main stacked structure of a magnetic tunnel junction element according to one embodiment of the present disclosure.

Preferred embodiments of the present disclosure will be described in detail below with reference to the accompanying figures. In addition, in the present specification and the figures, components having substantially the same functional configuration will be denoted by the same reference numerals, and thus repeated descriptions thereof will be omitted.

Also, in the figures referred to in the following description, sizes of some constituent members may be shown in an exaggerated manner for convenience of explanation. Therefore, relative sizes of the constituent members shown in the figures do not necessarily accurately represent a magnitude correlation between actual constituent members. Further, in the following description, stacking directions of a substrate and layers are represented as a vertical direction, a direction in which the substrate is present is represented as a downward direction, and a direction opposite the downward direction is represented as an upward direction.

Also, the description will be given in the following order.
1. Main configurational example
2. Other configurational examples
3. Modified example 1. Main Configurational Example First, a main configurational example of a magnetic tunnel junction element according to one embodiment of the present disclosure will be described with reference to FIG. 1. FIG. 1 is a vertical cross-sectional view schematically showing a main stacked structure of a magnetic tunnel junction element 1 according to the present embodiment.

As shown in FIG. 1, the magnetic tunnel junction element 1 includes a substrate 100, a lower electrode 110, a magnetization pinned layer 120, a first insulating layer 130, a magnetization free layer 140, an adjacent layer 150, a cap layer 160 configured to have a multilayer structure, and an upper electrode 170.

The magnetic tunnel junction element 1 according to the present embodiment is an STT-MRAM that controls a magnetization direction of the magnetization free layer 140 using torque due to electron spin. In the STT-MRAM, magnetization reversal efficiency due to spin injection can be improved by setting a direction of an axis of easy magnetization of the magnetization free layer 140 and the magnetization pinned layer 120 to a direction perpendicular to a film surface. For that reason, in the magnetic tunnel junction element 1, the magnetization free layer 140 and the magnetization pinned layer 120 are imparted with perpendicular magnetic anisotropy due to interfacial perpendicular magnetic anisotropy induced at interfaces between the magnetization pinned layer 120, the magnetization free layer 140, and the first insulating layer 130. The STT-MRAM such as the magnetic tunnel junction element 1 is also referred to as an interfacial perpendicular magnetization type STT-MRAM.

The substrate 100 is a member that supports each layer of the magnetic tunnel junction element 1. The substrate 100 may be formed of any one of a semiconductor, quartz, glass or an organic resin. For example, the substrate 100 may be formed of a semiconductor such as silicon (Si) or germanium (Ge), or a compound semiconductor such as gallium arsenide (GaAs), gallium nitride (GaN), or silicon carbide (SiC). Alternatively, the substrate 100 may be a SOI (Silicon On Insulator) substrate in which an insulating film such as $SiO_2$ is sandwiched in a silicon substrate.

The lower electrode 110 is provided on the substrate 100. The lower electrode 110 functions as a connection point between the magnetic tunnel junction element 1 and various wirings by being formed of various metal materials or alloy materials. The lower electrode 110 may be formed of known materials and have a stacked structure, for example, may be formed of a single-layer film, or may be formed of a stacked film of a plurality of films. Further, the lower electrode 110 may function as a base film for controlling crystal orientation of the magnetization pinned layer 120 provided on the lower electrode 110. In such a case, the lower electrode 110 may be formed of a metal material having substantially the same crystal structure or magnetic anisotropy as the magnetization pinned layer 120.

The magnetization pinned layer 120 is provided on the lower electrode 110. The magnetization pinned layer 120 is a magnetic layer having an axis of easy magnetization in a direction perpendicular to the film surface and having a fixed magnetization direction. The magnetization pinned layer 120 can be formed of known materials and have a stacked structure. The magnetization pinned layer 120 may be formed, for example, to have a stacked ferrimagnetic structure in which a ferromagnetic layer, a non-magnetic layer, and a ferromagnetic layer are alternately stacked. Further, the magnetization pinned layer 120 may be formed as a stacked film of various metal layers in order to fix the magnetization direction, to have perpendicular magnetic anisotropy, or to control the crystal structure.

The first insulating layer 130 is provided on the magnetization pinned layer 120. The first insulating layer 130 functions as a tunnel insulating film of an MTJ element by being formed of an insulating material. For example, the first insulating layer 130 may be formed of an inorganic oxide such as magnesium oxide (MgO) or aluminum oxide ($Al_2O_3$) as a thin film layer having a film thickness of about 1 nm. More specifically, the first insulating layer 130 may be formed of magnesium oxide (MgO) with a film thickness of about 1 nm. In a case in which the first insulating layer 130 is formed of magnesium oxide (MgO), the first insulating layer 130 becomes a layer having good crystallinity at a lower temperature, and thus a tunnel magnetoresistance effect (TMR effect) between the magnetization pinned layer 120 and the magnetization free layer 140 can be further enhanced.

The magnetization free layer 140 is provided on the first insulating layer 130. The magnetization free layer 140 is a magnetic layer which has an axis of easy magnetization in the direction perpendicular to the film surface due to the interfacial perpendicular magnetic anisotropy generated at the interface with the first insulating layer 130, and of which the magnetization direction can be controlled. Specifically, the magnetization free layer 140 may be formed of a magnetic material containing a 3d transition metal and boron (B), or may be formed of CoFeB with a film thickness of about 1 nm to 2 nm. In such a case, by setting the content of boron (B) to 15 atomic % or more, perpendicular magnetic anisotropy of the magnetization free layer 140 can be further enhanced.

In the present embodiment, the magnetic tunnel junction element (MTJ element) is configured by sandwiching the first insulating layer 130 between the magnetization pinned layer 120 and the magnetization free layer 140, which are ferromagnetic materials. In the magnetic tunnel junction element 1, a voltage is applied perpendicularly to bonding surfaces between the magnetization pinned layer 120, the magnetization free layer 140, and the first insulating layer 130, and thus a current flows due to a tunnel effect. A magnitude of the tunnel effect in this case changes depending on whether the magnetization directions of the magnetization pinned layer 120 and the magnetization free layer 140 are parallel or antiparallel. Therefore, the magnetic tunnel junction element 1 can control a magnitude of the current flowing between the lower electrode 110 and the upper electrode 170 by controlling the magnetization direction of the magnetization free layer 140.

The adjacent layer 150 is formed of a non-magnetic transition metal and is provided on and adjacent to the magnetization free layer 140. The adjacent layer 150 inhibits diffusion of boron (B), due to heat treatment or the like, contained in the magnetization free layer 140 from the magnetization free layer 140 to the cap layer 160 side.

Specifically, in the magnetic tunnel junction element 1, boron (B) contained in the magnetization free layer 140 may diffuse to surrounding layers due to heat treatment at a high temperature for a long time. In such a case, the content of boron (B) in the magnetization free layer 140 decreases, and thus it becomes difficult for the magnetization free layer 140 to maintain the perpendicular magnetic anisotropy. In particular, in a case in which the magnetic tunnel junction element 1 is processed into a columnar shape or a cone shape, a volume of the magnetization free layer 140 is limited, and thus the content of boron (B) in the magnetization free layer 140 tends to decrease due to diffusion. The adjacent layer 150 can retain boron (B) around the magnetization free layer 140 by trapping boron (B) diffused from the magnetization free layer 140. According to this, the adjacent layer 150 inhibits the diffusion of boron (B) due to the heat treatment, thereby inhibiting deterioration of perpendicular magnetic anisotropy of the magnetization free layer 140 due to the decrease in the content of boron (B).

The adjacent layer 150 can be formed of a non-magnetic transition metal having high density and thermal conductivity. For example, the adjacent layer 150 may be formed of any one of molybdenum (Mo), tungsten (W), niobium (Nb), Ir (iridium) and Ti (titanium). The adjacent layer 150 is formed of any one of molybdenum (Mo), tungsten (W), or niobium (Nb) having a higher density and thermal conductivity, so that it can more effectively inhibit the diffusion of boron (B). More specifically, the adjacent layer 150 may be formed of molybdenum (Mo).

The adjacent layer 150 may be formed with a film thickness of 0.25 nm or more and 1.0 nm or less. Since it is enough for the adjacent layer 150 to inhibit the diffusion of boron (B) to the extent that the magnetization free layer 140 can maintain the perpendicular magnetic anisotropy, the adjacent layer 150 may be formed of a thin film that does not affect other properties. As shown in examples described later, in a case in which the adjacent layer 150 is formed with a film thickness of 0.25 nm or more and 1.0 nm or less, the magnetic tunnel junction element 1 can increase the TMR effect (that is, the TMR ratio).

The cap layer 160 is formed on the adjacent layer 150. The cap layer 160 is provided in a multilayer structure in which a plurality of layers are stacked for the purpose of protecting the magnetization free layer 140 and the adjacent layer 150, improving characteristics of the magnetization free layer 140, and the like. Specifically, the cap layer 160 may be provided in a multilayer structure in which a second insulating layer 161, an intermediate layer 162, and a barrier layer 163 are stacked in order from the adjacent layer 150 side. Also, the cap layer 160 may have a multilayer structure other than the structure shown in FIG. 1. Variations of the multilayer structure of the cap layer 160 will be described later with reference to FIGS. 3 to 18.

The second insulating layer 161 is formed of an insulating material. For example, the second insulating layer 161 may be formed of an inorganic oxide such as magnesium oxide (MgO) or aluminum oxide ($Al_2O_3$) as a thin film layer having a film thickness of about 1 nm. More specifically, the second insulating layer 161 may be formed of magnesium oxide (MgO) with a film thickness of about 1 nm. Since the second insulating layer 161 can control the axis of easy magnetization of the magnetization free layer 140 in the direction perpendicular to the film surface due to the interfacial perpendicular magnetic anisotropy, the perpendicular magnetic anisotropy of the magnetization free layer 140 can be further enhanced.

The intermediate layer 162 is formed of a non-magnetic material. The intermediate layer 162 alleviates a difference in crystal orientation and the like between the layers adjacent to the intermediate layer 162. For example, the intermediate layer 162 may be formed of a non-magnetic material such as Ru, Pt, Pd, TiN or TaN with a film thickness of 1 nm or more and 10 nm or less. More specifically, the intermediate layer 162 may be formed of ruthenium (Ru) with a film thickness of 1 nm.

The barrier layer 163 is formed of a non-magnetic transition metal. The barrier layer 163 prevents a metal contained in the upper electrode 170 from diffusing into the magnetization free layer 140 or the first insulating layer 130 below the cap layer 160 due to heat treatment or the like. Specifically, in the magnetic tunnel junction element 1, atoms of a metal such as tantalum (Ta) contained in the upper electrode 170 may diffuse into the magnetization free layer 140 or the first insulating layer 130 due to heat treatment at a high temperature for a long time. In such a case, since the interface between the magnetization free layer 140 and the first insulating layer 130 is disturbed by the diffused tantalum (Ta) or the like, the interfacial perpendicular magnetic anisotropy of the magnetization free layer 140 deteriorates. The barrier layer 163 traps the tantalum (Ta) or the like diffused from the upper electrode 170 to prevent the interface between the magnetization free layer 140 and the first insulating layer 130 from being disturbed by the tantalum (Ta) or the like. According to this, the barrier layer 163 can prevent deterioration of the perpendicular magnetic anisotropy of the magnetization free layer 140 due to the diffusion of atoms resulting from the heat treatment.

The barrier layer 163 can be formed of a non-magnetic transition metal having high density and thermal conductivity, similarly to the adjacent layer 150. For example, the barrier layer 163 may be formed of any one of molybdenum (Mo), tungsten (W), niobium (Nb), Ir (iridium), and Ti (titanium). Also, the barrier layer 163 may be formed of the same non-magnetic transition metal as the adjacent layer 150, or may be formed of a different non-magnetic transition metal. More specifically, the barrier layer 163 may be formed of molybdenum (Mo).

For example, the barrier layer 163 may be formed of a metal having a product of density and thermal conductivity larger than a product of density and thermal conductivity of the metal contained in the upper electrode 170. Here, a melting point, density, and thermal conductivity of each of tantalum (Ta), molybdenum (Mo), tungsten (W), niobium (Nb), Ir (iridium), and Ti (titanium) are as shown in Table 1 below. Therefore, in a case in which the metal contained in the upper electrode 170 is tantalum (Ta), the barrier layer 163 may be formed of molybdenum (Mo), iridium (Ir), or tungsten (W) having a product of density and thermal conductivity larger than a product of density and thermal conductivity of tantalum (Ta). In such a case, the barrier layer 163 can more effectively inhibit the diffusion of the metal atoms from the upper electrode 170.

TABLE 1

| Material | Melting point (° C.) | Density (g/cm³) | Thermal conductivity (W/m · K) |
|---|---|---|---|
| Mo | 2623 | 10.22 | 127 |
| Ir | 2433 | 22.42 | 139 |
| W | 3407 | 19.3 | 139 |
| Nb | 2477 | 8.57 | 53.7 |
| Ti | 1665 | 4.54 | 19 |
| Ta | 2985 | 16.65 | 58.5 |

The barrier layer 163 may be formed with a film thickness of 1.0 nm or more and 10 nm or less. That is, the barrier layer 163 can be formed with a film thickness thicker than that of the adjacent layer 150 formed of the same material. According to this, the barrier layer 163 can more reliably prevent the diffusion of tantalum (Ta) from the upper electrode 170 to the magnetization free layer 140 or the first insulating layer 130. As shown in examples described later, in a case in which the barrier layer 163 is formed with a film thickness of 1.0 nm or more, the diffusion of the metal from the upper electrode 170 can be sufficiently prevented, and thus an He variation of the magnetic tunnel junction element 1 can be reduced. On the other hand, in a case in which the barrier layer 163 is formed with a film thickness of 10 nm or less, workability of the magnetic tunnel junction element 1 is improved, and thus secondary characteristic variations due to processing accuracy and the like can be reduced.

The upper electrode 170 is provided on the cap layer 160. The upper electrode 170 is formed of various metal materials or alloy materials to function as a connection point between the magnetic tunnel junction element 1 and various wirings. The upper electrode 170 may be formed of known materials and have a stacked structure, for example, may be formed of a single-layer film, or may be formed of a stacked film of a plurality of films. Further, the upper electrode 170 may function as a hard mask when the magnetic tunnel junction element 1 is processed by etching or the like. In such a case, the upper electrode 170 may be formed to contain tantalum (Ta) or tantalum nitride (TaN). More specifically, the upper electrode 170 may be formed to have a multilayer structure in which a Ru film with a film thickness of 1 nm, a Ta film with a film thickness of 1 nm, a Ru film with a film thickness of 5 nm, and a Ta film with a film thickness of 77 nm are stacked in order from the cap layer 160 side. Alternatively, the upper electrode 170 may be formed to have a multilayer structure in which a Ru film with a film thickness of 1 nm, a Ta film with a film thickness of 1 nm, a Ru film with a film thickness of 5 nm, and a TaN film with a film thickness of 77 nm are stacked in order from the cap layer 160 side, a multilayer structure in which a Ru film with a film thickness of 1 nm, a TaN film with a film thickness of 1 nm, a Ru film with a film thickness of 5 nm, and a Ta film with a film thickness of 77 nm are stacked in order, or a multilayer structure in which a Ru film with a film thickness of 1 nm, a TaN film with a film thickness of 1 nm, a Ru film with a film thickness of 5 nm, and a TaN film with a film thickness of 77 nm are stacked in order.

As described above, in the magnetic tunnel junction element 1 according to the present embodiment, the adjacent layer 150 formed of the non-magnetic transition metal is provided adjacent to the magnetization free layer 140, and the barrier layer 163 similarly formed of the non-magnetic transition metal is provided in the cap layer 160. As a result, the magnetic tunnel junction element 1 according to the present embodiment can improve thermal resistance thereof.

Figure 2A:
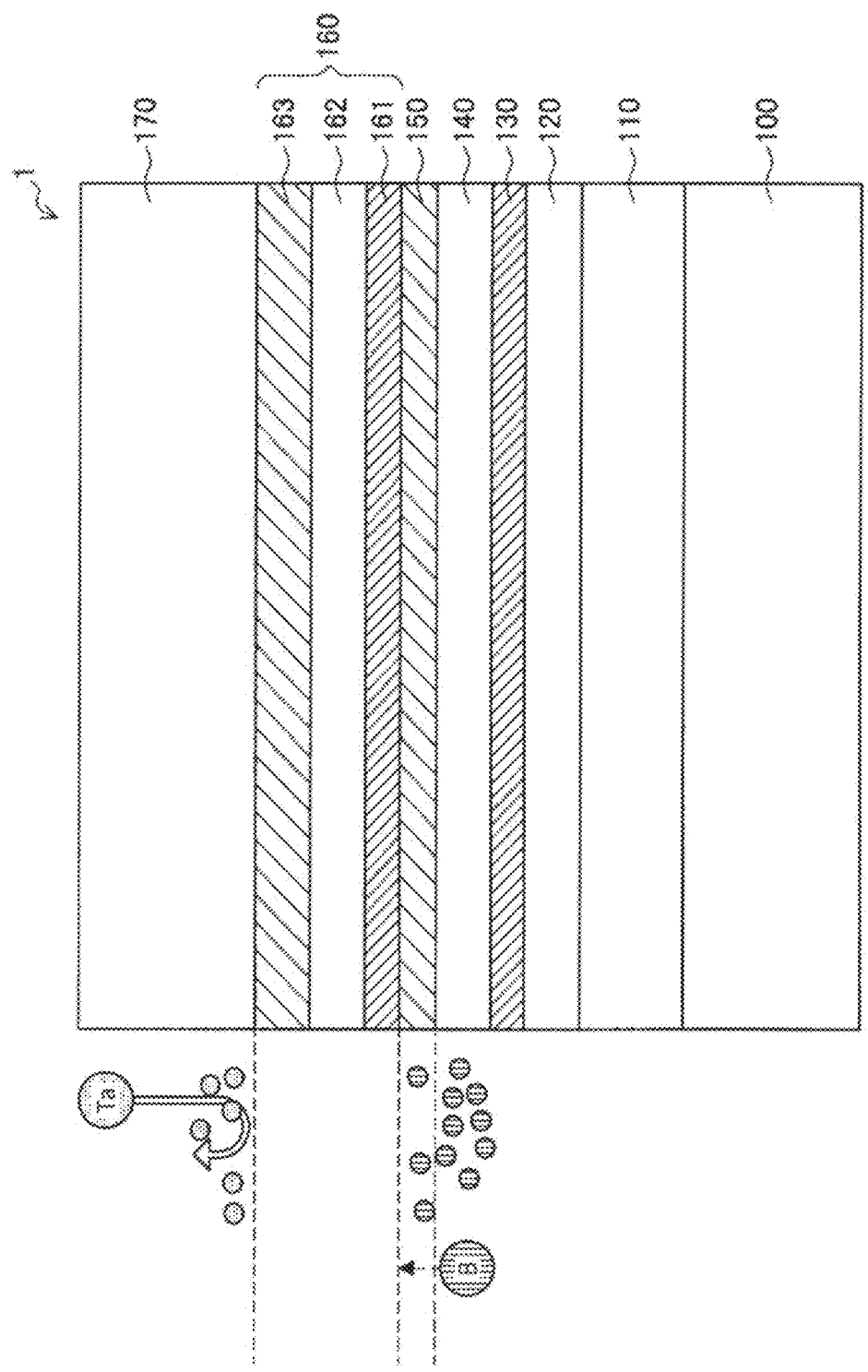
FIG. 2A is a vertical cross-sectional view schematically showing a state of atom diffusion when the magnetic tunnel junction element according to the same embodiment is heat-treated.

Such an effect will be described more specifically with reference to FIGS. 2A and 2B. FIG. 2A is a vertical cross-sectional view schematically showing a state of diffusion of atoms when the magnetic tunnel junction element 1 according to the present embodiment is heat-treated. FIG. 2B is a vertical cross-sectional view schematically showing a state of diffusion of atoms when a magnetic tunnel junction element 90 according to a comparative example is heat-treated.

As shown in FIG. 2B, the magnetic tunnel junction element 90 according to the comparative example is not provided with the adjacent layer 150 and the barrier layer 163 as compared with the magnetic tunnel junction element 1. Therefore, in the magnetic tunnel junction element 90 according to the comparative example, atoms of the metal such as tantalum (Ta) contained in the upper electrode 170 diffuse to the cap layer 160 side in a case in which the heat treatment is performed at a high temperature for a long time. The tantalum (Ta) diffused due to the heat treatment disturbs the interface between the magnetization free layer 140 and the first insulating layer 130 and reduces the interfacial perpendicular magnetic anisotropy, thereby reducing the perpendicular magnetic anisotropy of the magnetization free layer 140. Further, in the magnetization free layer 140, boron (B) contained in the magnetization free layer 140 diffuses to the cap layer 160 side, and thus the content of boron (B) decreases, which makes it difficult to maintain the perpendicular magnetic anisotropy.

Therefore, in the magnetic tunnel junction element 90 according to the comparative example, the perpendicular magnetic anisotropy of the magnetization free layer 140 deteriorates due to the heat treatment at a high temperature for a long time. In such a case, since it becomes difficult for the magnetic tunnel junction element 90 to control the axis of easy magnetization of the magnetization free layer 140 in the direction perpendicular to the film surface, it becomes difficult to achieve desired magnetic characteristics. Therefore, since the magnetic tunnel junction element 90 according to the comparative example has low heat resistance, it is difficult to perform the heat treatment at a high temperature for a long time.

On the other hand, as shown in FIG. 2A, in the magnetic tunnel junction element 1 according to the present embodiment, the barrier layer 163 prevents atoms of the metal such as tantalum (Ta) contained in the upper electrode 170 from diffusing toward the cap layer 160 side in a case in which the heat treatment is performed at a high temperature for a long time. As a result, in the magnetic tunnel junction element 1 according to the present embodiment, the interface between the magnetization free layer 140 and the first insulating layer 130 is not disturbed by the tantalum (Ta) or the like, and thus the magnetization free layer 140 can maintain the perpendicular magnetic anisotropy. Further, the adjacent layer 150 inhibits the boron (B) contained in the magnetization free layer 140 from diffusing to the cap layer 160 side. Therefore, the magnetization free layer 140 can retain a sufficient amount of boron (B) to maintain the perpendicular magnetic anisotropy.

Therefore, in the magnetic tunnel junction element 1 according to the present embodiment, by inhibiting the diffusion of atoms generated due to the heat treatment at a high temperature for a long time, deterioration of the perpendicular magnetic anisotropy of the magnetization free layer 140 can be inhibited. According to this, the magnetic tunnel junction element 1 according to the present embodiment can maintain desired magnetic characteristics even in a case in which a high-load heat treatment is performed.

Therefore, the magnetic tunnel junction element 1 according to the present embodiment can be consolidated on a semiconductor device in which various circuits such as logic circuits, memory circuits, and pixel circuits are consolidated and various heat treatment processes are performed, without restricting manufacturing processes.

2. Other Configurational Examples

Next, other configurational examples of the magnetic tunnel junction element 1 according to the present embodiment will be described with reference to FIGS. 3 to 18. FIGS. 3 to 18 are vertical cross-sectional views schematically showing other stacked structures of magnetic tunnel junction elements 2 to 17 according to the present embodiment.

The other stacked structures of the magnetic tunnel junction elements 2 to 17 shown in FIGS. 3 to 18 are different from the stacked structure of the magnetic tunnel junction element 1 shown in FIG. 1 only in the stacked structure inside the cap layer 160. Therefore, only the differences of each cap layer 160 between the magnetic tunnel junction elements 1 to 17 shown in FIGS. 1 and 3 to 18 will be described below, and the descriptions of respective common layers of the substrate 100 to the adjacent layer 150 and the upper electrode 170 will be omitted.

Figure 3:
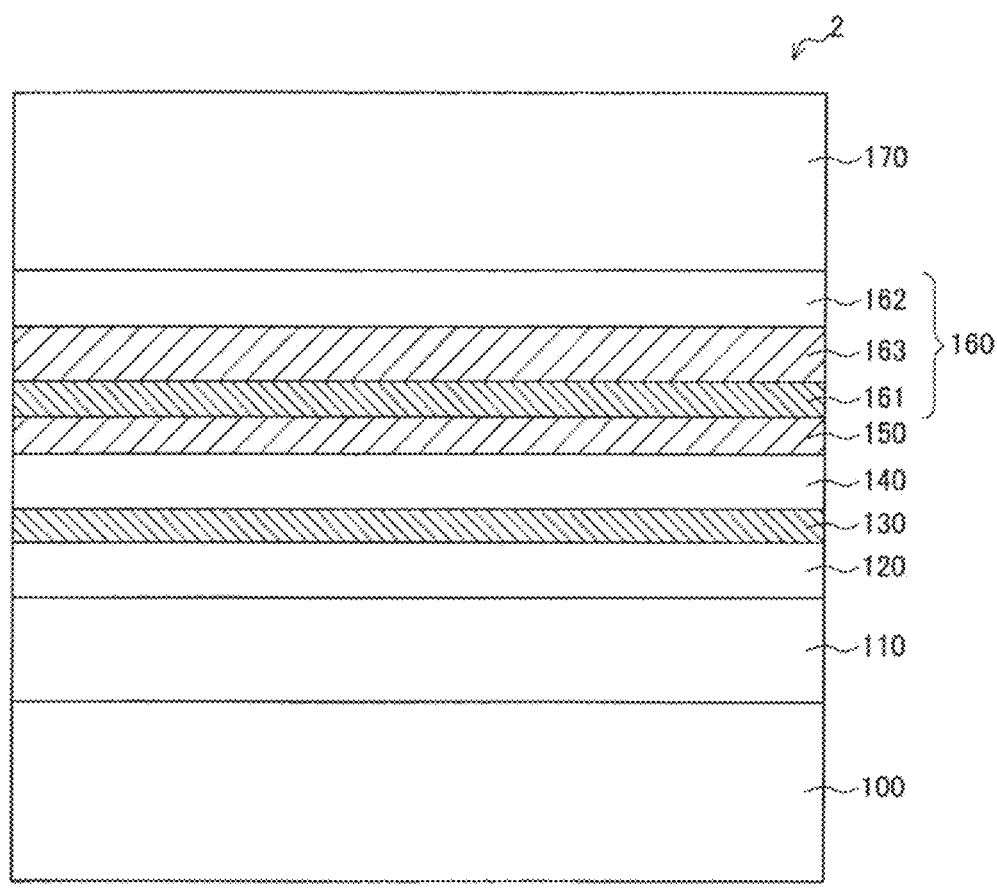
FIG. 3 is a vertical cross-sectional view schematically showing another stacked structure of the magnetic tunnel junction element according to the same embodiment.

As shown in FIG. 3, the magnetic tunnel junction element 2 is different from the magnetic tunnel junction element 1 shown in FIG. 1 in that a stacking order of the intermediate layer 162 and the barrier layer 163 is changed. Specifically, the cap layer 160 of the magnetic tunnel junction element 2 has a structure in which the second insulating layer 161, the barrier layer 163, and the intermediate layer 162 are stacked from the adjacent layer 150 side. That is, the barrier layer 163 does not have to be provided adjacent to the upper electrode 170 and may be provided at any position of the cap layer 160. Since the barrier layer 163 is a layer that prevents the metal from diffusing from the upper electrode 170 to the interface between the magnetization free layer 140 and the first insulating layer 130, the barrier layer 163 may be provided at any position between the upper electrode 170 and the adjacent layer 150.

However, in the case in which the cap layer 160 includes the second insulating layer 161, the second insulating layer 161 is provided adjacent to the adjacent layer 150 in order to enhance the perpendicular magnetic anisotropy of the magnetization free layer 140 due to the interfacial perpendicular magnetic anisotropy. In such a case, the barrier layer 163 is provided at any position between the upper electrode 170 and the second insulating layer 161.

Figure 4:
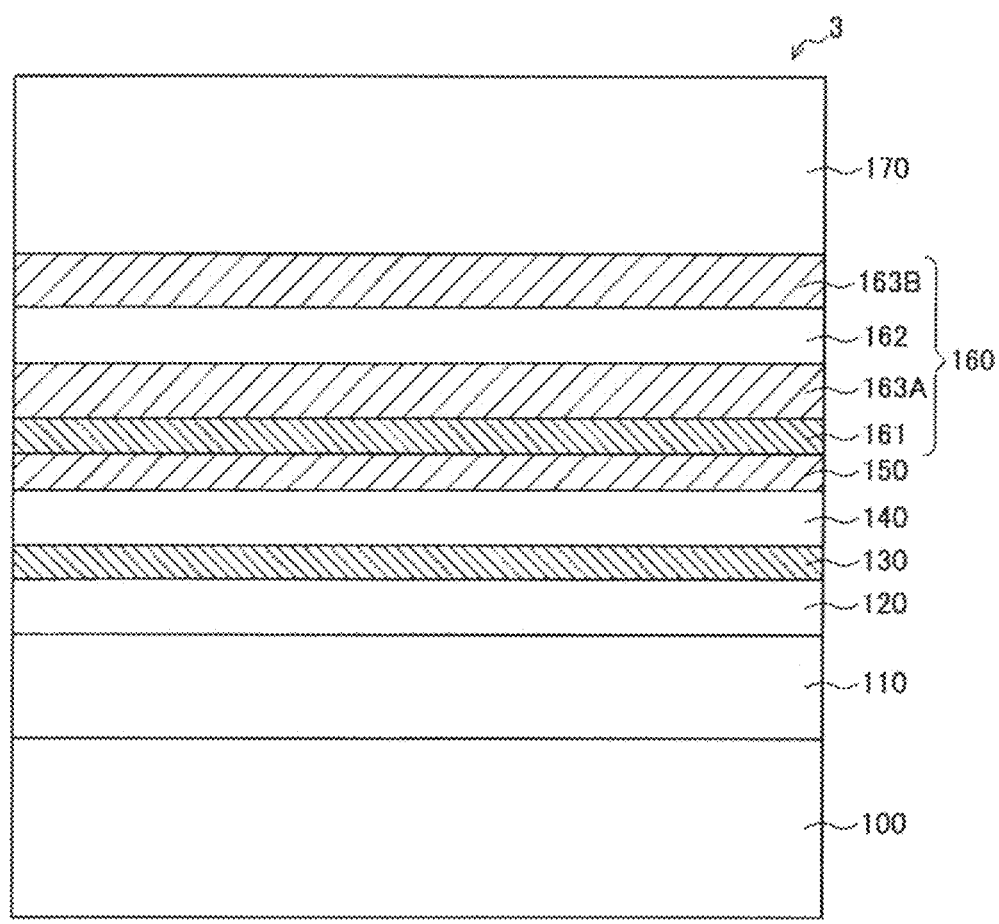
FIG. 4 is a vertical cross-sectional view schematically showing another stacked structure of the magnetic tunnel junction element according to the same embodiment.

As shown in FIG. 4, the magnetic tunnel junction element 3 is different from the magnetic tunnel junction element 1 shown in FIG. 1 in that it is provided with a plurality of barrier layers 163A and 163B. Specifically, the cap layer 160 of the magnetic tunnel junction element 3 includes a structure in which the second insulating layer 161, a first barrier layer 163A, the intermediate layer 162, and a second barrier layer 163B are stacked from the adjacent layer 150 side.

The first barrier layer 163A and the second barrier layer 163B are formed of the same material and with the same film thickness as the barrier layer 163 of the magnetic tunnel junction element 1 shown in FIG. 1 and prevent the diffusion of tantalum (Ta) and the like from the upper electrode 170. Since the magnetic tunnel junction element 3 shown in FIG. 4 is provided with the plurality of barrier layers 163A and 163B, the diffusion of tantalum (Ta) and the like from the upper electrode 170 during the heat treatment is more reliably prevented, so that deterioration of the perpendicular magnetic anisotropy of the magnetization free layer 140 can be more reliably prevented.

Figure 5:
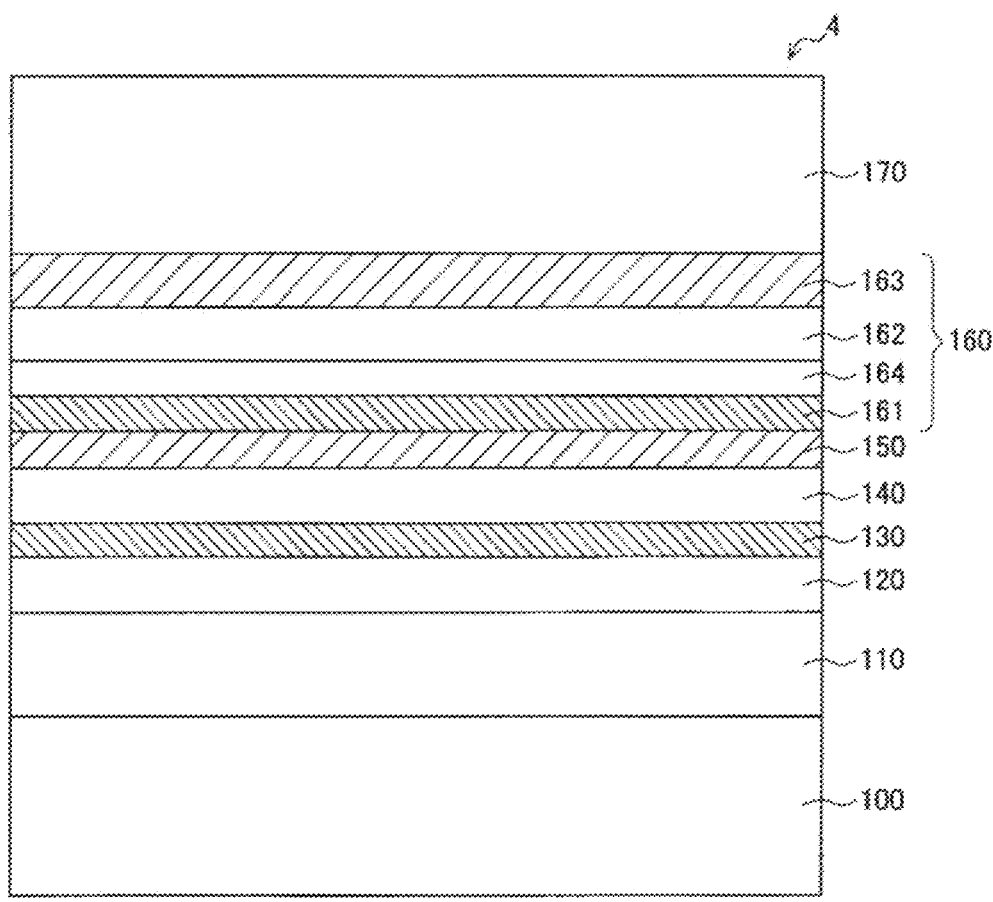
FIG. 5 is a vertical cross-sectional view schematically showing another stacked structure of the magnetic tunnel junction element according to the same embodiment.

As shown in FIG. 5, the magnetic tunnel junction element 4 is different from the magnetic tunnel junction element 1 shown in FIG. 1 in that a magnetic layer 164 is inserted between the second insulating layer 161 and the intermediate layer 162. Specifically, the cap layer 160 of the magnetic tunnel junction element 4 includes a structure in which the second insulating layer 161, the magnetic layer 164, the intermediate layer 162, and the barrier layer 163 are stacked from the adjacent layer 150 side.

The magnetic layer 164 is formed of a magnetic material containing a 3d transition metal and boron (B), similarly to the magnetization free layer 140, and improves magnetic characteristics of the magnetic tunnel junction element 4. Specifically, the magnetic layer 164 is stacked adjacent to the second insulating layer 161 to improve crystallinity of the second insulating layer 161 after the heat treatment. As a result, the magnetic layer 164 can improve the perpendicular magnetic anisotropy of the magnetization free layer 140 via the adjacent layer 150.

For example, the magnetic layer 164 may be formed of CoFeB with a film thickness of 0.9 nm or less. Perpendicular magnetic anisotropy of the magnetic layer 164 can be further enhanced by setting the content of boron (B) to 15 atomic % or more. As shown in examples described later, the magnetic layer 164 provided on the second insulating layer 161 is formed with a film thickness of 0.9 nm or less, so that the magnetic tunnel junction element 4 can have high perpendicular magnetic anisotropy and coercive force. Also, a lower limit of the film thickness of the magnetic layer 164 is not particularly limited, but may be 0.1 nm. In the magnetic tunnel junction element 4 shown in FIG. 5, since the magnetic layer 164 is provided in addition to the magnetization free layer 140, the magnetic characteristics of the entire magnetic tunnel junction element 4 can be improved.

Figure 6:
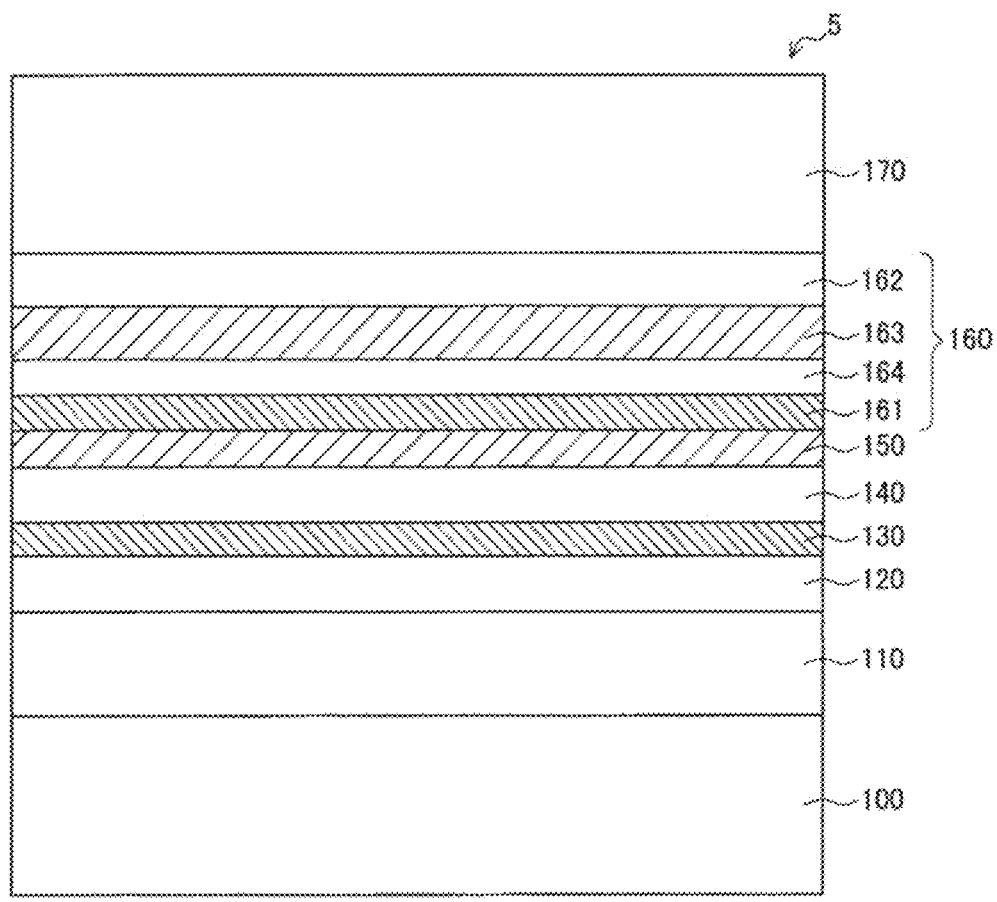
FIG. 6 is a vertical cross-sectional view schematically showing another stacked structure of the magnetic tunnel junction element according to the same embodiment.

As shown in FIG. 6, the magnetic tunnel junction element 5 is different from the magnetic tunnel junction element 4 shown in FIG. 5 in that the stacking order of the intermediate layer 162 and the barrier layer 163 is changed. Specifically, the cap layer 160 of the magnetic tunnel junction element 5 includes a structure in which the second insulating layer 161, the magnetic layer 164, the barrier layer 163, and the intermediate layer 162 are stacked from the adjacent layer 150 side. That is, the barrier layer 163 does not have to be provided adjacent to the upper electrode 170 and may be provided at any position of the cap layer 160. Since the barrier layer 163 is a layer that prevents the diffusion of the metal from the upper electrode 170, it may be provided at any position between the upper electrode 170 and the magnetic layer 164.

Figure 7:
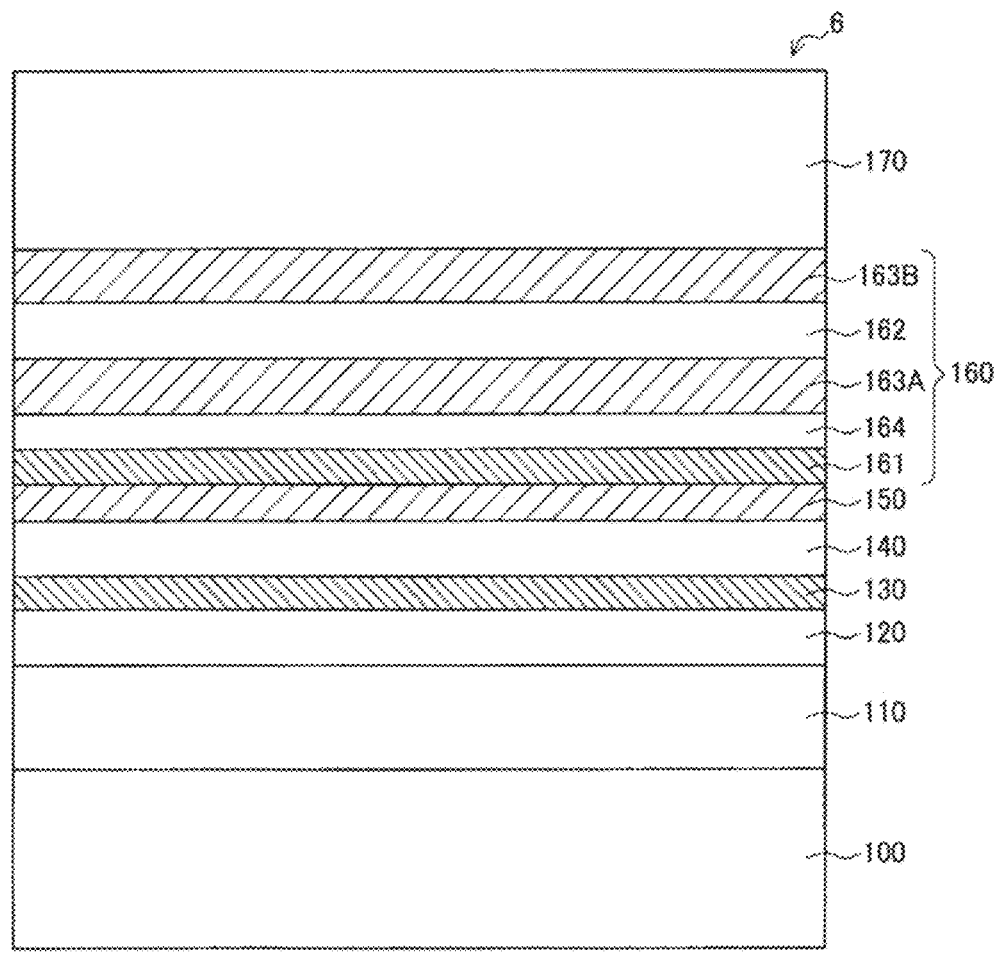
FIG. 7 is a vertical cross-sectional view schematically showing another stacked structure of the magnetic tunnel junction element according to the same embodiment.

As shown in FIG. 7, the magnetic tunnel junction element 6 is different from the magnetic tunnel junction element 3 shown in FIG. 4 in that it is provided with the plurality of barrier layers 163A and 163B. Specifically, the cap layer 160 of the magnetic tunnel junction element 6 includes a stacked structure in which the second insulating layer 161, the magnetic layer 164, the first barrier layer 163A, the intermediate layer 162, and the second barrier layer 163B are stacked from the adjacent layer 150 side.

The first barrier layer 163A and the second barrier layer 163B are formed of the same material and with the same film thickness as the barrier layer 163 of the magnetic tunnel junction element 1 shown in FIG. 1 and prevent the diffusion of tantalum (Ta) and the like from the upper electrode 170.

In addition, the first barrier layer 163A can inhibit the diffusion of boron (B) from the magnetic layer 164. Since the magnetic tunnel junction element 6 shown in FIG. 7 is provided with the plurality of barrier layers 163A and 163B, the diffusion of tantalum (Ta) and the like from the upper electrode 170 during the heat treatment is more reliably prevented, so that deterioration of the perpendicular magnetic anisotropy of the magnetization free layer 140 and the magnetic layer 164 can be more reliably prevented.

Figure 8:
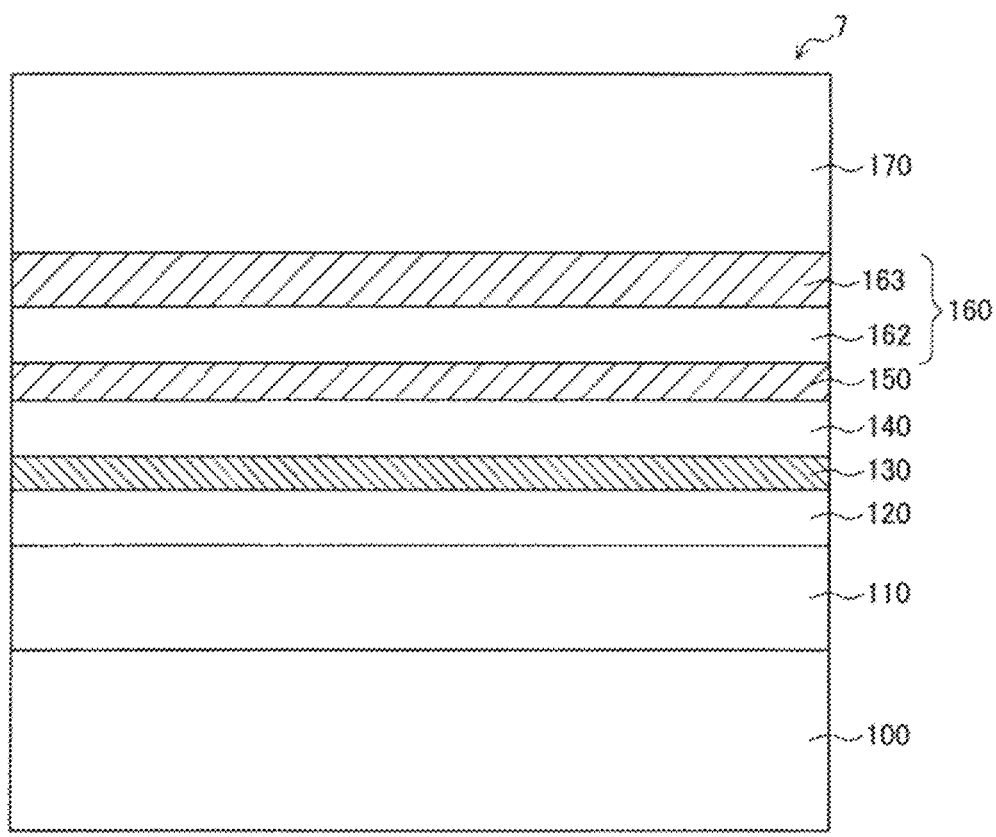
FIG. 8 is a vertical cross-sectional view schematically showing another stacked structure of the magnetic tunnel junction element according to the same embodiment.

As shown in FIG. 8, the magnetic tunnel junction element 7 is different from the magnetic tunnel junction element 1 shown in FIG. 1 in that the second insulating layer 161 is not provided and each layer of the cap layer 160 is formed of a conductive material. Specifically, the cap layer 160 of the magnetic tunnel junction element 7 includes a structure in which the intermediate layer 162 and the barrier layer 163 are stacked from the adjacent layer 150 side. Since the second insulating layer 161 is a layer that enhances the perpendicular magnetic anisotropy of the magnetization free layer 140 due to the interfacial perpendicular magnetic anisotropy, it may not be provided depending on a degree of the perpendicular magnetic anisotropy of the magnetization free layer 140. In the magnetic tunnel junction element 7 shown in FIG. 8, it is possible to reduce manufacturing costs by simplifying the stacked structure of the cap layer 160.

Figure 9:
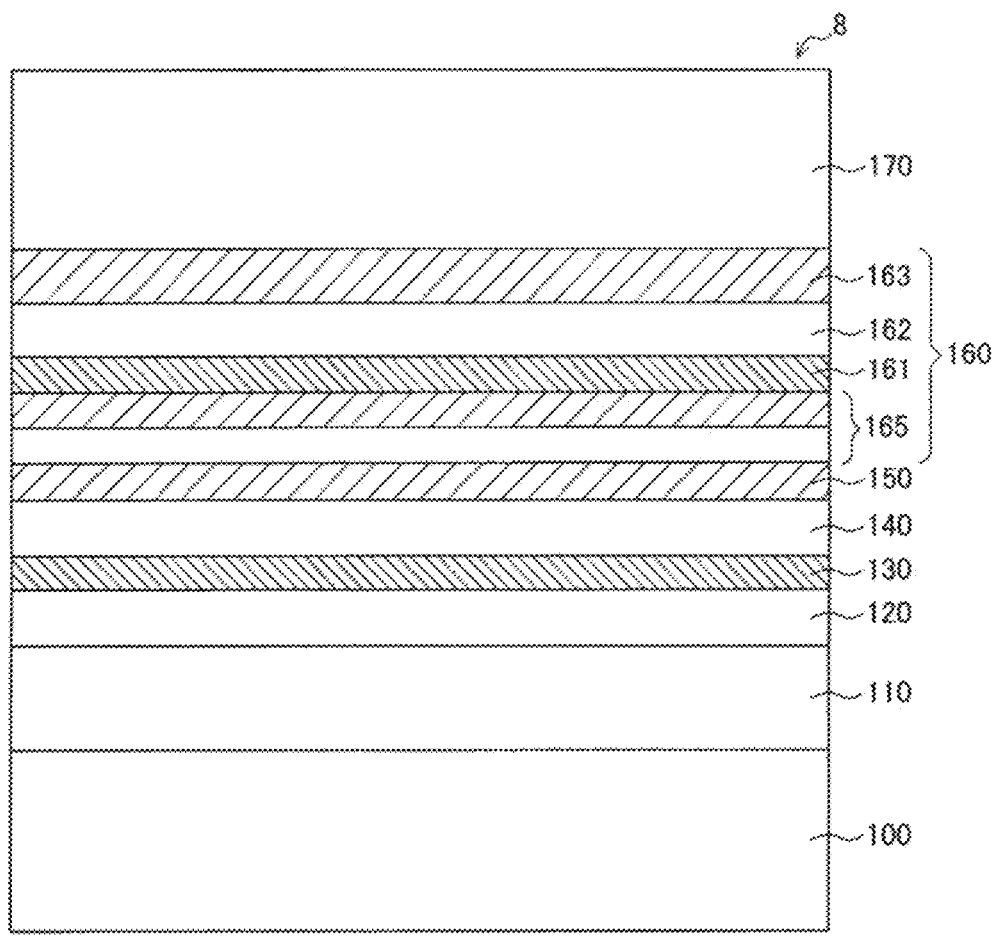
FIG. 9 is a vertical cross-sectional view schematically showing another stacked structure of the magnetic tunnel junction element according to the same embodiment.

As shown in FIG. 9, the magnetic tunnel junction element 8 is different from the magnetic tunnel junction element 1 shown in FIG. 1 in that an adjusting layer 165 in which a magnetic layer formed of a magnetic material containing a 3d transition metal and boron (B) and a non-magnetic layer formed of a non-magnetic transition metal are stacked is inserted between the second insulating layer 161 and the intermediate layer 162. Specifically, the cap layer 160 of the magnetic tunnel junction element 8 includes a structure in which the adjusting layer 165 configured of the magnetic layer and the non-magnetic layer, the second insulating layer 161, the intermediate layer 162, and the barrier layer 163 are stacked from the adjacent layer 150 side.

The magnetic layer of the adjusting layer 165 is formed of a magnetic material containing a 3d transition metal and boron (B), similarly to the magnetization free layer 140, and may be formed of, for example, CoFeB with a film thickness of 0.7 nm or less. Perpendicular magnetic anisotropy of the adjusting layer 165 can be further enhanced by setting the content of boron (B) to 15 atomic % or more. As shown in examples described later, the magnetic layer of the adjusting layer 165 is formed with a film thickness of 0.7 nm or less, so that an excessive increase of a writing voltage can be prevented. Also, a lower limit of the film thickness of the magnetic layer of the adjusting layer 165 is not particularly limited, but may be 0.1 nm.

The non-magnetic layer of the adjusting layer 165 is formed of a non-magnetic transition metal such as molybdenum (Mo), tungsten (W), niobium (Nb), Ir (iridium), or Ti (titanium), similarly to the adjacent layer 150, and may be formed of, for example, molybdenum (Mo) with a film thickness of 0.25 nm or more and 1.0 nm or less. The non-magnetic layer of the adjusting layer 165 can inhibit the diffusion of boron (B) contained in the underlying magnetic layer due to heat treatment.

In the magnetic tunnel junction element 8 shown in FIG. 9, by including the adjusting layer 165 having the same stacked structure as the magnetization free layer 140 and the adjacent layer 150 in the cap layer 160, it becomes possible to control a concentration of boron (B) in the vicinity of the magnetization free layer 140 after the heat treatment with higher accuracy. According to this, the magnetic tunnel junction element 8 can more reliably prevent deterioration of the perpendicular anisotropy of the magnetization free layer 140 due to the heat treatment.

Figure 10:
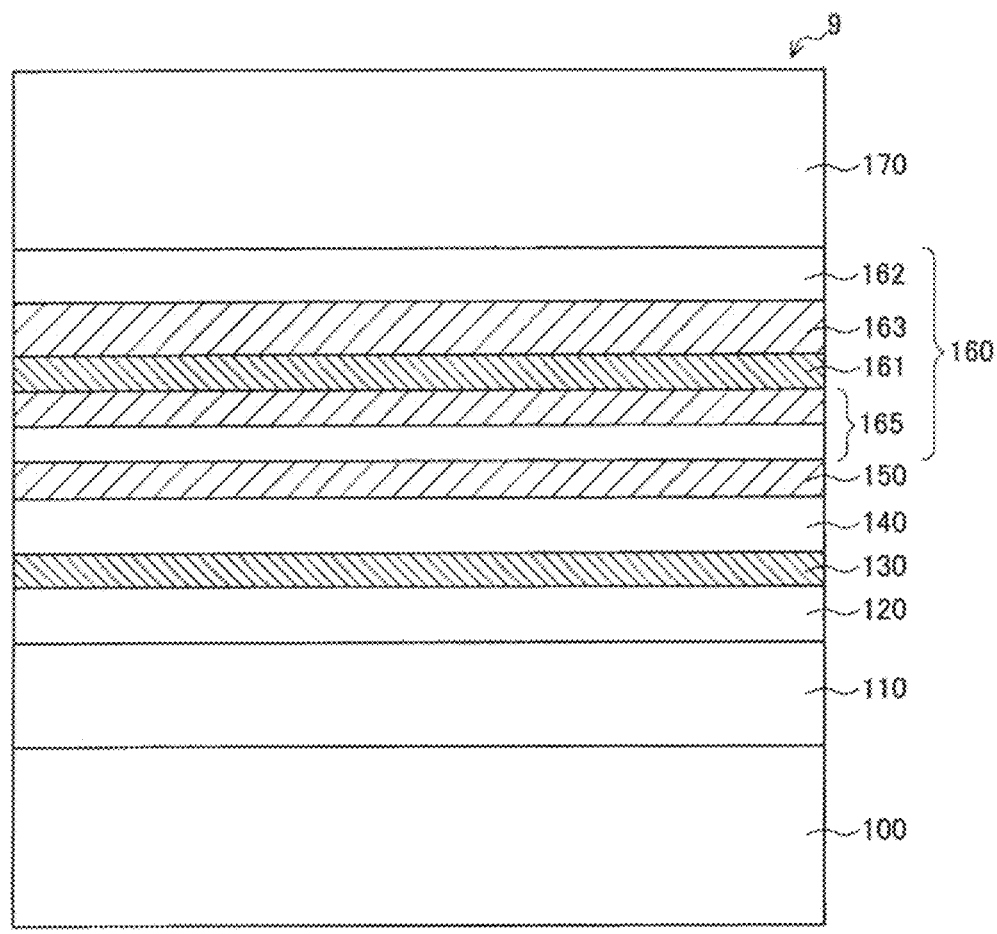
FIG. 10 is a vertical cross-sectional view schematically showing another stacked structure of the magnetic tunnel junction element according to the same embodiment.

The magnetic tunnel junction element 9 shown in FIG. 10 is different from the magnetic tunnel junction element 8 shown in FIG. 9 in that the stacking order of the intermediate layer 162 and the barrier layer 163 is changed. Specifically, the cap layer 160 of the magnetic tunnel junction element 9 includes a structure in which an adjusting layer 165 configured of a magnetic layer and a non-magnetic layer, the second insulating layer 161, the barrier layer 163, and the intermediate layer 162 are stacked from the adjacent layer 150 side. That is, the barrier layer 163 does not have to be provided adjacent to the upper electrode 170 and may be provided at any position of the cap layer 160. Since the barrier layer 163 is a layer that prevents the metal from diffusing from the upper electrode 170 to the interface between the magnetization free layer 140 and the first insulating layer 130, it may be provided at any position between the upper electrode 170 and the second insulating layer 161.

Figure 11:
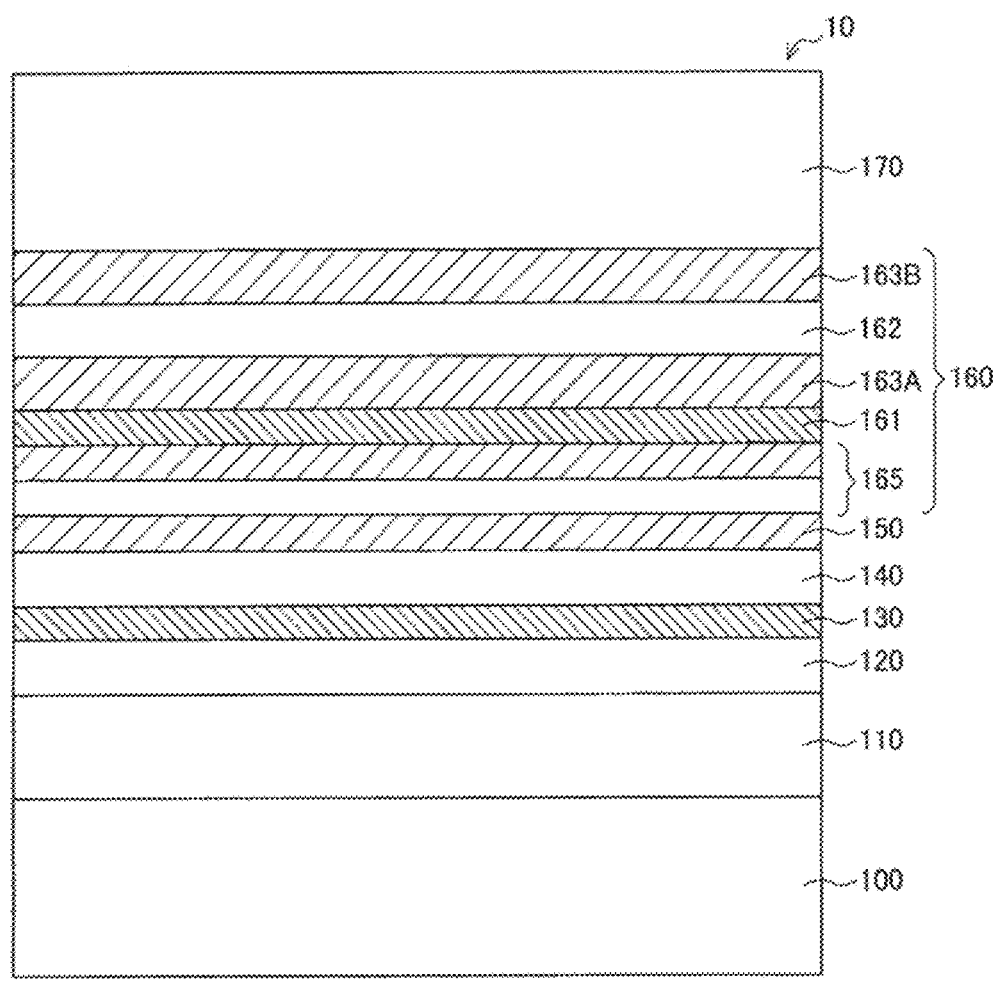
FIG. 11 is a vertical cross-sectional view schematically showing another stacked structure of the magnetic tunnel junction element according to the same embodiment.

As shown in FIG. 11, the magnetic tunnel junction element 10 is different from the magnetic tunnel junction element 8 shown in FIG. 9 in that it is provided with the plurality of barrier layers 163A and 163B. Specifically, the cap layer 160 of the magnetic tunnel junction element 10 includes a structure in which the adjusting layer 165 configured of the magnetic layer and the non-magnetic layer, the second insulating layer 161, the first barrier layer 163A, the intermediate layer 162, and the second barrier layer 163B are stacked.

The first barrier layer 163A and the second barrier layer 163B are formed of the same material and with the same film thickness as the barrier layer 163 of the magnetic tunnel junction element 1 shown in FIG. 1 and prevent the diffusion of tantalum (Ta) and the like from the upper electrode 170. Since the magnetic tunnel junction element 10 shown in FIG. 11 is provided with the plurality of barrier layers 163A and 163B, the diffusion of tantalum (Ta) and the like from the upper electrode 170 during the heat treatment is more reliably prevented, so that deterioration of the perpendicular magnetic anisotropy of the magnetization free layer 140 can be more reliably prevented.

Figure 12:
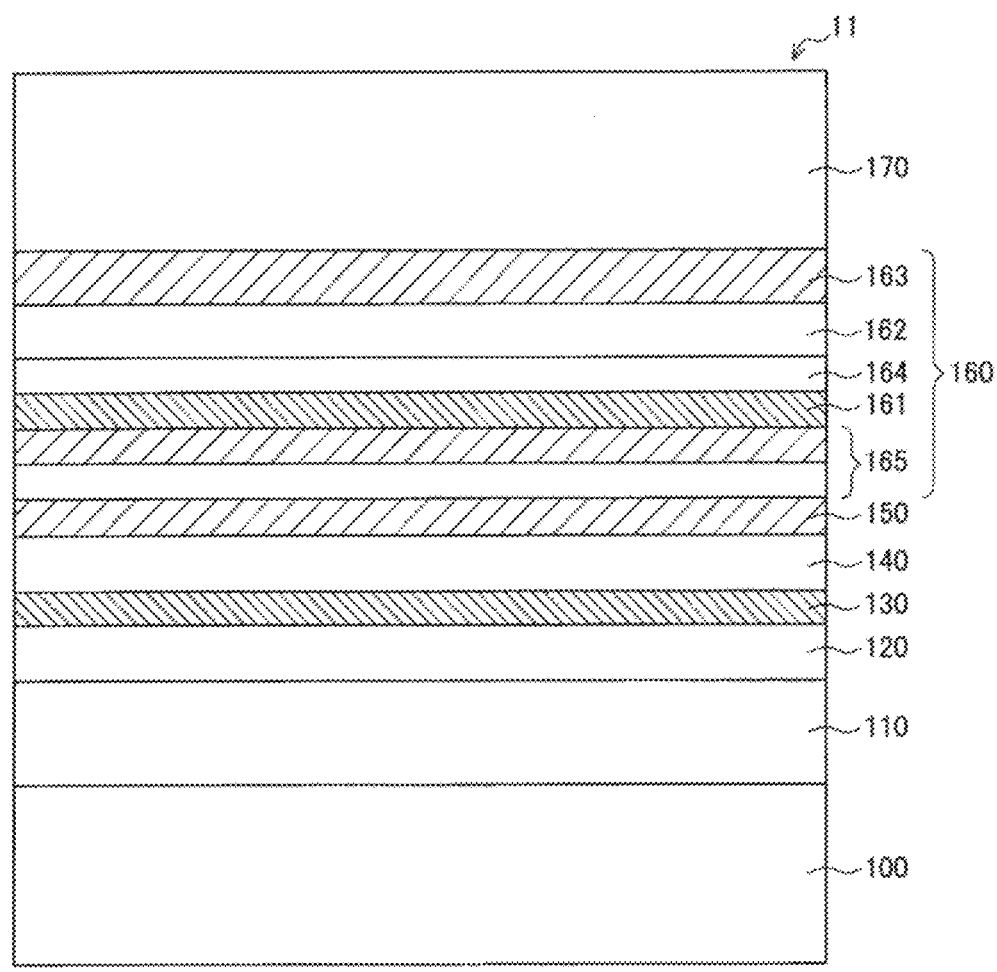
FIG. 12 is a vertical cross-sectional view schematically showing another stacked structure of the magnetic tunnel junction element according to the same embodiment.

As shown in FIG. 12, the magnetic tunnel junction element 11 is different from the magnetic tunnel junction element 8 shown in FIG. 9 in that the magnetic layer 164 is inserted between the second insulating layer 161 and the intermediate layer 162. Specifically, the cap layer 160 of the magnetic tunnel junction element 11 includes a structure in which the adjusting layer 165 configured of the magnetic layer and the non-magnetic layer, the second insulating layer 161, the magnetic layer 164, the intermediate layer 162, and the barrier layer 163 are stacked from the adjacent layer 150 side.

The magnetic layer 164 is formed of a magnetic material containing a 3d transition metal and boron (B), similarly to the magnetization free layer 140, and improves the magnetic characteristics of the magnetic tunnel junction element 11. Specifically, the magnetic layer 164 is stacked adjacent to the second insulating layer 161 to improve crystallinity of the second insulating layer 161 after the heat treatment. As a result, the magnetic layer 164 can improve the perpendicular magnetic anisotropy of the magnetization free layer 140 via the adjacent layer 150.

For example, the magnetic layer 164 may be formed of CoFeB with a film thickness of 0.9 nm or less. The perpendicular magnetic anisotropy of the magnetic layer 164 can be further enhanced by setting the content of boron (B) to 15 atomic % or more. As shown in examples described later, the magnetic layer 164 provided on the second insulating layer 161 is formed with a film thickness of 0.9 nm or less so that the magnetic tunnel junction element 11 can have high perpendicular magnetic anisotropy and coercive force. Also, the lower limit of the film thickness of the magnetic layer 164 is not particularly limited, but may be 0.1 nm. In the magnetic tunnel junction element 11 shown in FIG. 12, since the magnetic layer 164 is provided in addition to the magnetization free layer 140, magnetic characteristics of the entire magnetic tunnel junction element 11 can be improved.

Figure 13:
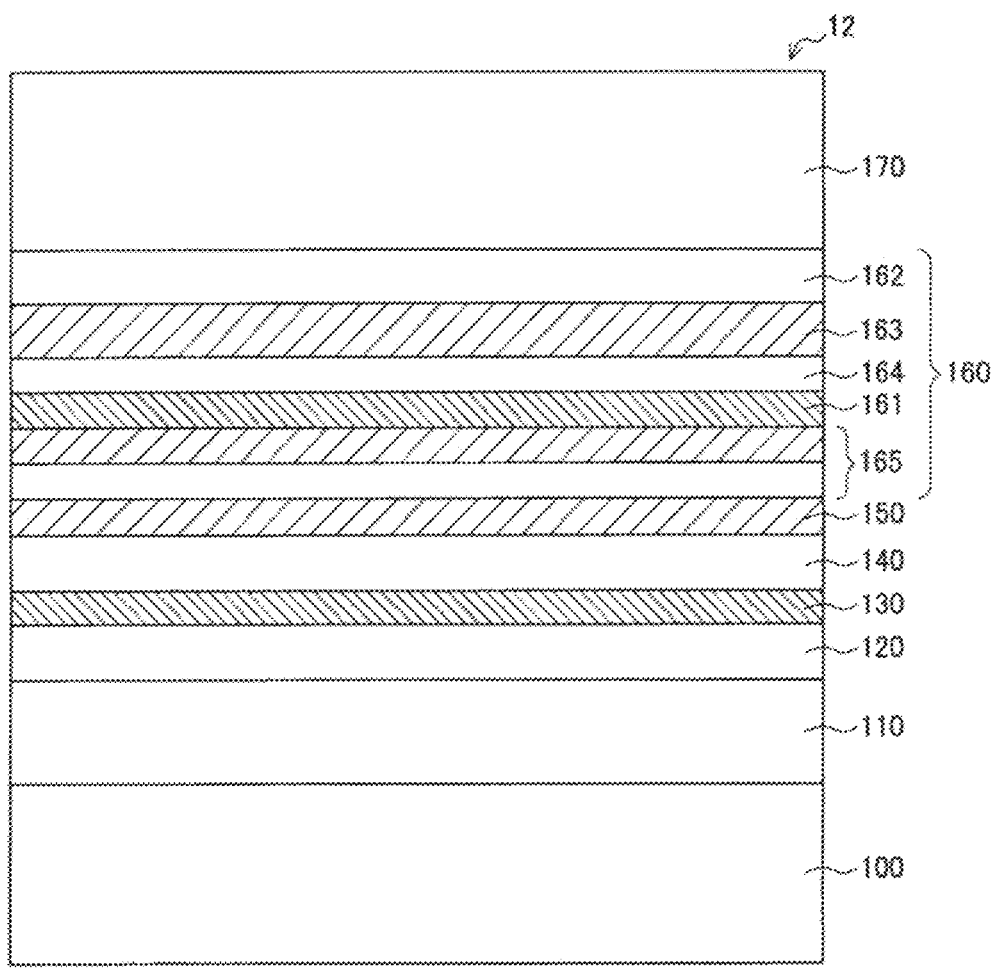
FIG. 13 is a vertical cross-sectional view schematically showing another stacked structure of the magnetic tunnel junction element according to the same embodiment.

As shown in FIG. 13, the magnetic tunnel junction element 12 is different from the magnetic tunnel junction element 11 shown in FIG. 12 in that the stacking order of the intermediate layer 162 and the barrier layer 163 is changed. Specifically, the cap layer 160 of the magnetic tunnel junction element 12 includes a structure in which the adjusting layer 165 configured of the magnetic layer and the non-magnetic layer, the second insulating layer 161, the magnetic layer 164, the barrier layer 163, and the intermediate layer 162 are stacked from the adjacent layer 150 side. That is, the barrier layer 163 does not have to be provided adjacent to the upper electrode 170 and may be provided at any position of the cap layer 160. Since the barrier layer 163 is a layer that prevents the diffusion of the metal from the upper electrode 170, it may be provided at any position between the upper electrode 170 and the magnetic layer 164.

Figure 14:
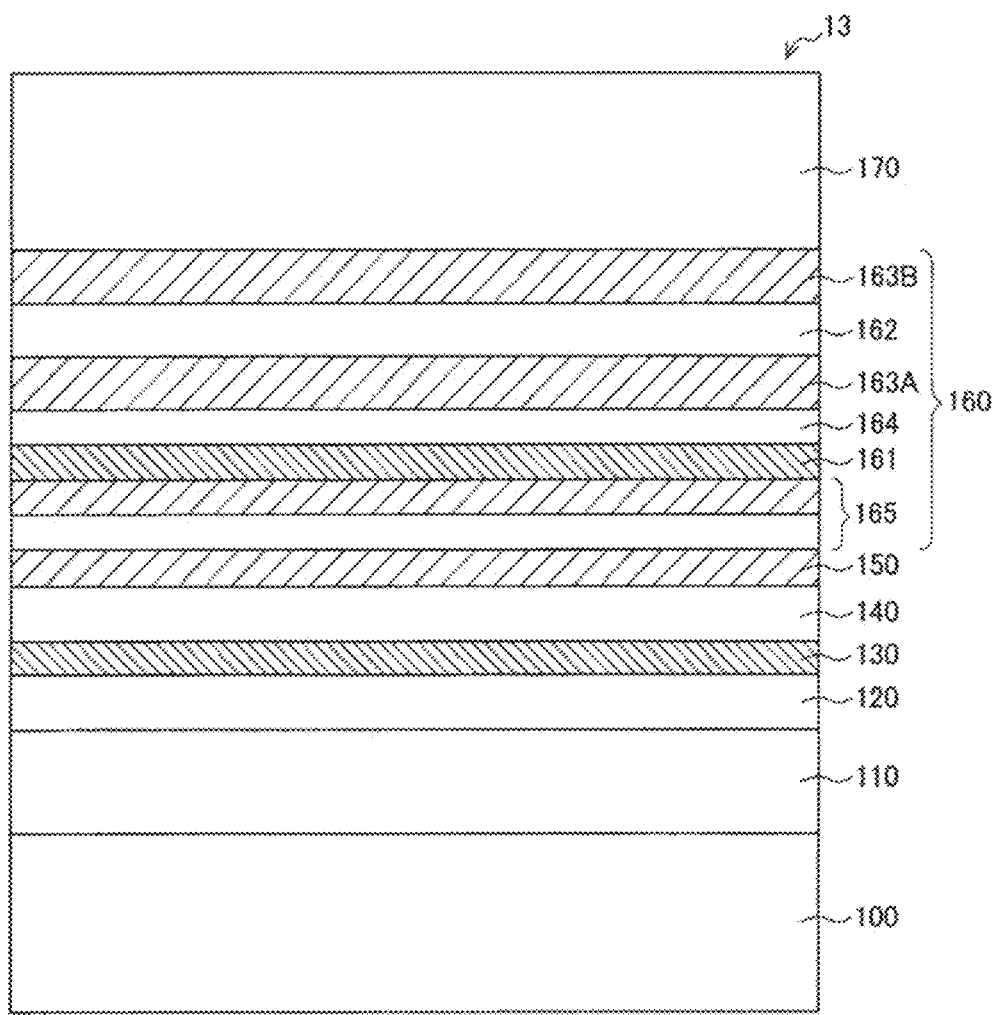
FIG. 14 is a vertical cross-sectional view schematically showing another stacked structure of the magnetic tunnel junction element according to the same embodiment.

As shown in FIG. 14, the magnetic tunnel junction element 13 is different from the magnetic tunnel junction element 11 shown in FIG. 12 in that it is provided with the plurality of barrier layers 163A and 163B. Specifically, the cap layer 160 of the magnetic tunnel junction element 13 includes a structure in which the adjusting layer 165 configured of the magnetic layer and the non-magnetic layer, the second insulating layer 161, the magnetic layer 164, the first barrier layer 163A, the intermediate layer 162, and the second barrier layer 163B are stacked from the adjacent layer 150 side.

The first barrier layer 163A and the second barrier layer 163B are formed of the same material and with the same film thickness as the barrier layer 163 of the magnetic tunnel junction element 1 shown in FIG. 1 and prevent the diffusion of tantalum (Ta) and the like from the upper electrode 170. In addition, the first barrier layer 163A can inhibit the diffusion of boron (B) from the magnetic layer 164. Since the magnetic tunnel junction element 13 shown in FIG. 14 is provided with the plurality of barrier layers 163A and 163B, the diffusion of tantalum (Ta) and the like from the upper electrode 170 during the heat treatment is more reliably prevented, so that deterioration of the perpendicular magnetic anisotropy of the magnetization free layer 140 and the magnetic layer 164 can be more reliably prevented.

Figure 15:
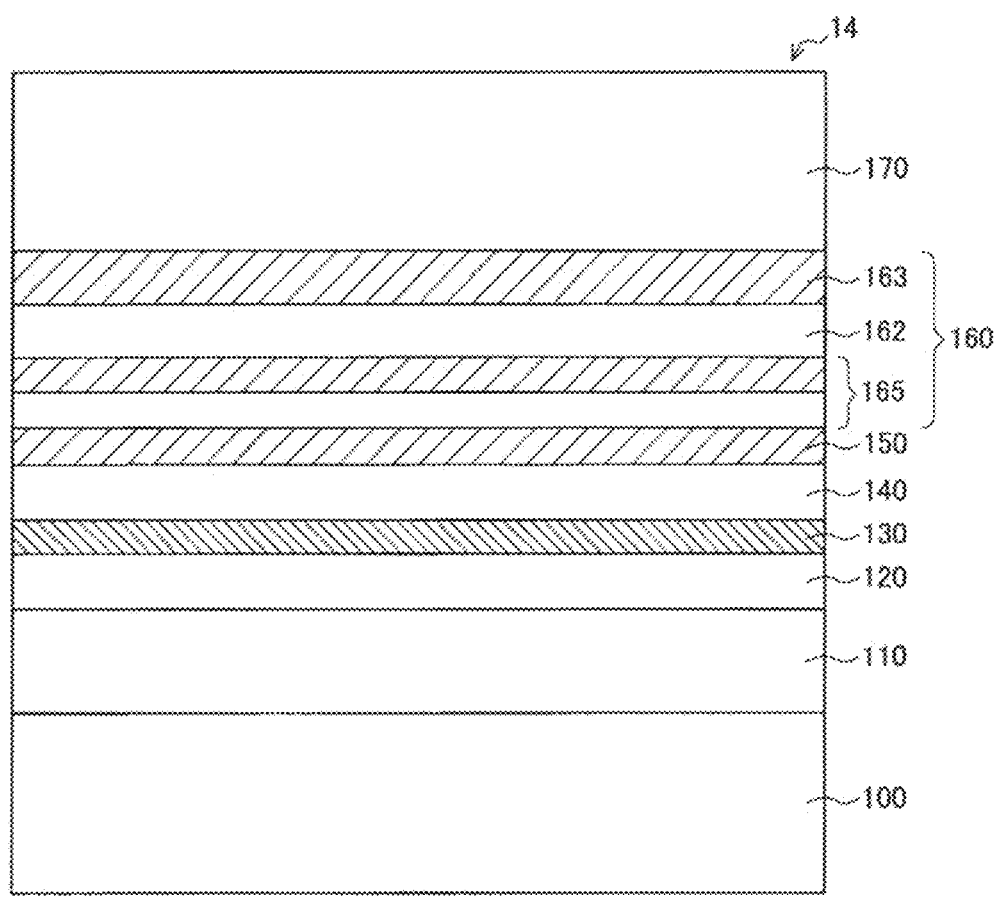
FIG. 15 is a vertical cross-sectional view schematically showing another stacked structure of the magnetic tunnel junction element according to the same embodiment.

As shown in FIG. 15, the magnetic tunnel junction element 14 is different from the magnetic tunnel junction element 8 shown in FIG. 9 in that the second insulating layer 161 is not provided and each layer of the cap layer 160 is formed of a conductive material. Specifically, the cap layer 160 of the magnetic tunnel junction element 14 includes a structure in which the adjusting layer 165 configured of the magnetic layer and the non-magnetic layer, the intermediate layer 162, and the barrier layer 163 are stacked from the adjacent layer 150 side. Since the second insulating layer 161 is a layer that enhances the perpendicular magnetic anisotropy of the magnetization free layer 140 due to the interfacial perpendicular magnetic anisotropy, it may not be provided depending on the degree of the perpendicular magnetic anisotropy of the magnetization free layer 140. In the magnetic tunnel junction element 14 shown in FIG. 15, it is possible to reduce manufacturing costs by simplifying the stacked structure of the cap layer 160.

Figure 16:
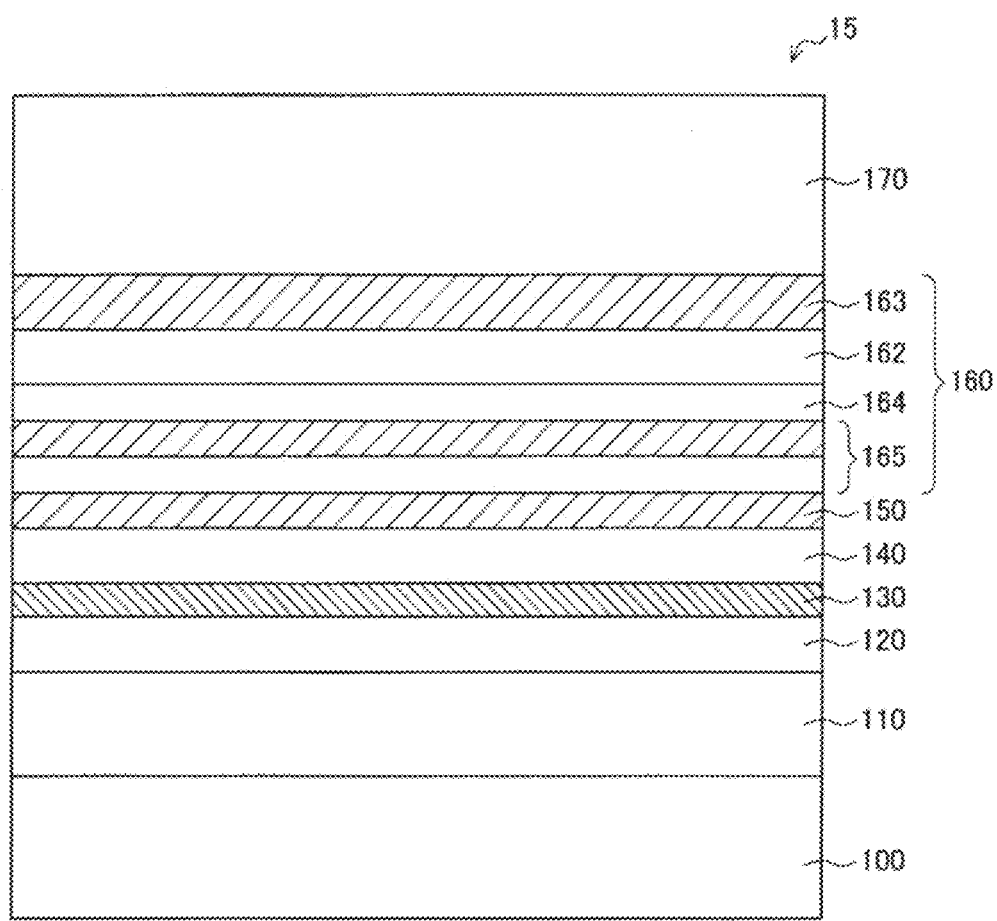
FIG. 16 is a vertical cross-sectional view schematically showing another stacked structure of the magnetic tunnel junction element according to the same embodiment.

As shown in FIG. 16, the magnetic tunnel junction element 15 is different from the magnetic tunnel junction element 14 shown in FIG. 15 in that the magnetic layer 164 is inserted between the adjusting layer 165 and the intermediate layer 162. Specifically, the cap layer 160 of the magnetic tunnel junction element 15 includes a structure in which the adjusting layer 165 configured of the magnetic layer and the non-magnetic layer, the magnetic layer 164, the intermediate layer 162, and the barrier layer 163 are stacked from the adjacent layer 150 side.

For example, the magnetic layer 164 may be formed of a magnetic material containing a 3d transition metal and boron (B) or may be formed of CoFeB with a film thickness of 0.9 nm or less. The perpendicular magnetic anisotropy of the magnetic layer 164 can be further enhanced by setting the content of boron (B) to 15 atomic % or more. As shown in examples described later, the magnetic layer 164 is formed with a film thickness of 0.9 nm or less, so that the magnetic tunnel junction element 15 can have high perpendicular magnetic anisotropy and coercive force. Also, the lower limit of the film thickness of the magnetic layer 164 is not particularly limited, but may be 0.1 nm. In the magnetic tunnel junction element 15 shown in FIG. 16, since the magnetic layer 164 is provided in addition to the magnetization free layer 140, the magnetic characteristics of the entire magnetic tunnel junction element 15 can be improved.

Figure 17:
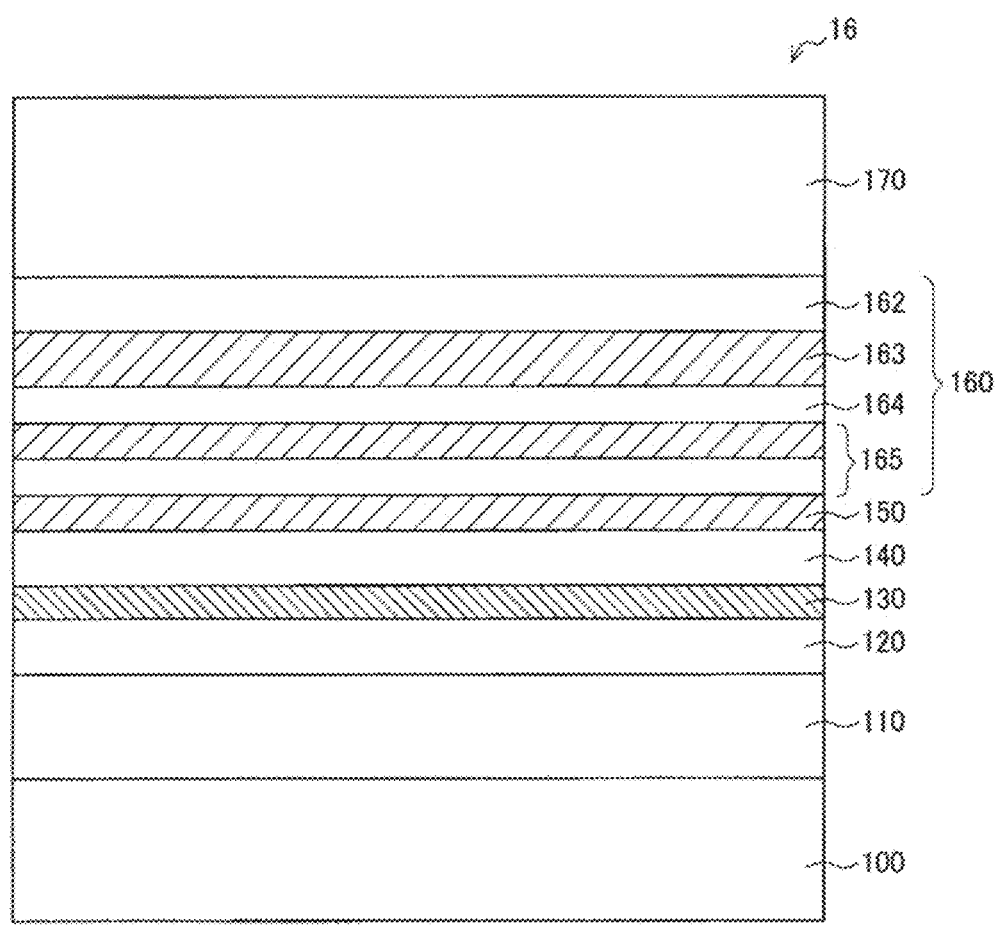
FIG. 17 is a vertical cross-sectional view schematically showing another stacked structure of the magnetic tunnel junction element according to the same embodiment.

As shown in FIG. 17, the magnetic tunnel junction element 16 is different from the magnetic tunnel junction element 15 shown in FIG. 16 in that the stacking order of the intermediate layer 162 and the barrier layer 163 is changed. Specifically, the cap layer 160 of the magnetic tunnel junction element 16 includes a structure in which the adjusting layer 165 configured of the magnetic layer and the non-magnetic layer, the magnetic layer 164, the barrier layer 163, and the intermediate layer 162 are stacked from the adjacent layer 150 side. That is, the barrier layer 163 does not have to be provided adjacent to the upper electrode 170 and may be provided at any position of the cap layer 160. Since the barrier layer 163 is a layer that prevents the diffusion of the metal from the upper electrode 170, it may be provided at any position between the upper electrode 170 and the magnetic layer 164.

Figure 18:
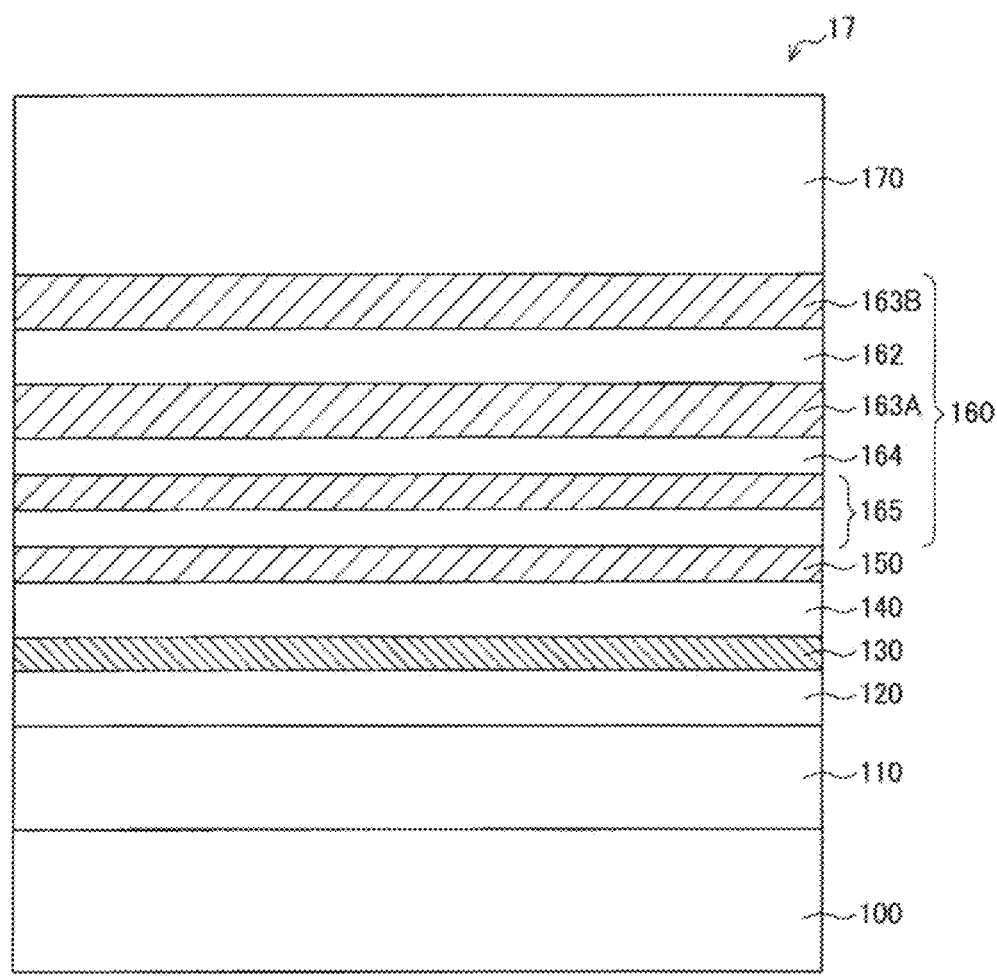
FIG. 18 is a vertical cross-sectional view schematically showing another stacked structure of the magnetic tunnel junction element according to the same embodiment.

As shown in FIG. 18, the magnetic tunnel junction element 17 is different from the magnetic tunnel junction element 15 shown in FIG. 16 in that it is provided with the plurality of barrier layers 163A and 163B. Specifically, the cap layer 160 of the magnetic tunnel junction element 17 includes a structure in which the adjusting layer 165 configured of the magnetic layer and the non-magnetic layer, the magnetic layer 164, the first barrier layer 163A, the intermediate layer 162, and the second barrier layer 163B are stacked from the adjacent layer 150 side.

The first barrier layer 163A and the second barrier layer 163B are formed of the same material and with the same film thickness as the barrier layer 163 of the magnetic tunnel junction element 1 shown in FIG. 1 and prevent the diffusion of tantalum (Ta) and the like from the upper electrode 170. In addition, the first barrier layer 163A can inhibit the diffusion of boron (B) from the magnetic layer 164. Since the magnetic tunnel junction element 17 shown in FIG. 18 is provided with the plurality of barrier layers 163A and 163B, the diffusion of tantalum (Ta) and the like from the upper electrode 170 during the heat treatment is more reliably prevented, so that deterioration of the perpendicular magnetic anisotropy of the magnetization free layer 140 and the magnetic layer 164 can be more reliably prevented.

The configurational examples of the magnetic tunnel junction elements 1 to 17 according to the present embodiment have been described above. Each of the layers constituting the magnetic tunnel junction elements 1 to 17 according to the present embodiment can be formed using a sputtering method. Film forming conditions of the sputtering method are not particularly limited, and the optimum conditions can be appropriately selected.

3. Modified Example

Figure 19:
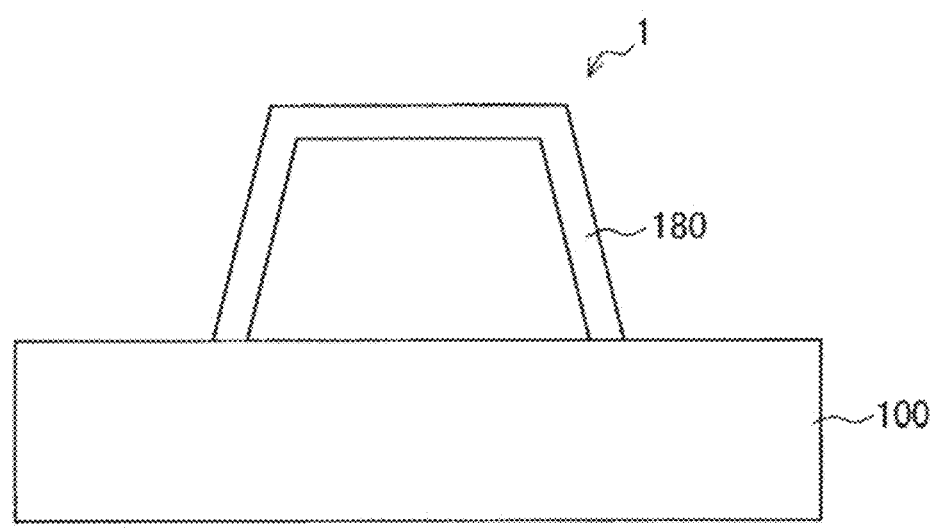
FIG. 19 is a vertical cross-sectional view schematically showing a modified example of the magnetic tunnel junction element according to the same embodiment.

Next, a modified example of the magnetic tunnel junction element 1 according to the present embodiment will be described with reference to FIG. 19. FIG. 19 is a vertical cross-sectional view schematically showing a magnetic tunnel junction element 1 according to the present modified example.

As shown in FIG. 19, the magnetic tunnel junction element 1 according to the present modified example is processed by etching or the like, and a surface exposed after the processing is covered with a protective film 180. Also, the protective film 180 may cover at least side surfaces of the magnetic tunnel junction element 1 and may not necessarily cover an upper surface of the magnetic tunnel junction element 1.

The protective film 180 is an insulating film such as $SiN_x$ or $SiO_x$ and can be formed using a physical film forming method such as PVD (Physical Vapor Deposition). For example, the protective film 180 may be a SiN film formed by using plasma PVD.

In the magnetic tunnel junction element 1 after the element is processed by etching or the like, end surfaces of the magnetization free layer 140, the magnetization pinned layer 120, and the like are exposed. For that reason, in a case in which these end surfaces are exposed to a raw material gas (for example, $SiH_4$ or $NH_3$) used in a chemical deposition method such as CVD (chemical vapor deposition), the magnetic characteristics of the magnetization free layer 140 and the magnetization pinned layer 120 may be deteriorated due to chemical reactions. Therefore, the protective film 180 is formed by using a physical film forming method, so that deterioration of the magnetic characteristics of the magnetic tunnel junction element 1 after the processing can be prevented.

A film thickness of the protective film 180 is not particularly limited, but may be, for example, 5 nm or more and 30 nm or less. The protective film 180 can be formed, for example, by performing reactive sputtering in an Ar and $N_2$ gas atmosphere using a silicon (Si) target having a purity of more than 5N. Each flow rate of Ar gas and N2 gas may be, for example, 20 sccm.

The magnetic tunnel junction element 1 of which the side surfaces are protected by the protective film 180 formed by such a physical film forming method can further reduce the writing voltage. Since the writing voltage of the magnetic tunnel junction element 1 that has been heat-treated at a high temperature for a long time tends to increase due to a heat load, it is more preferable to reduce the writing voltage using the protective film 180 described above.

Examples

Hereinafter, the magnetic tunnel junction element according to the present embodiment will be specifically described with reference to the examples and comparative examples. In addition, the examples presented below are merely examples and the magnetic tunnel junction element according to the present embodiment is not limited to the following examples.

<Verification of Effects of Magnetic Tunnel Junction Element According to Present Embodiment>

Figure 20:
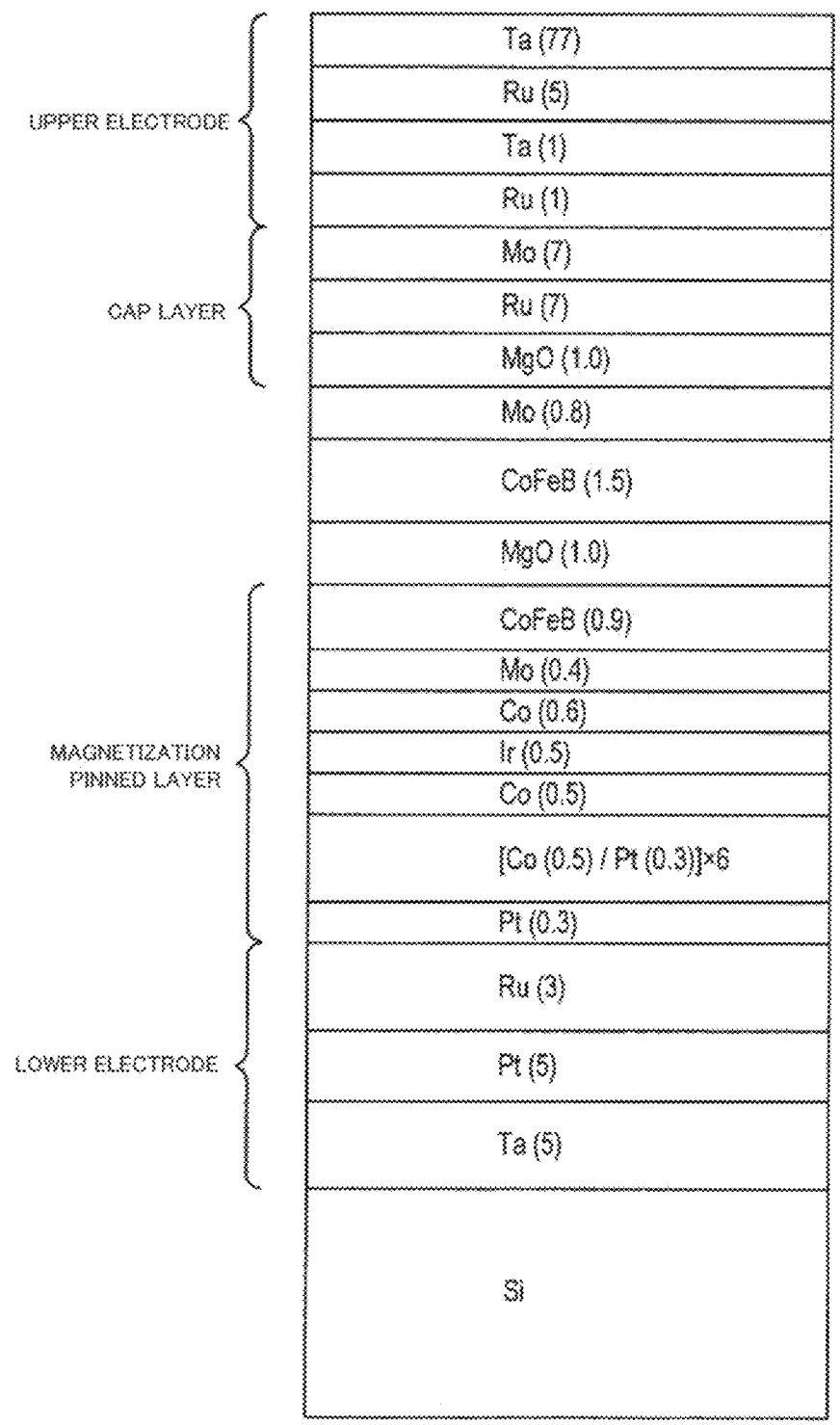
FIG. 20 is an explanatory diagram showing a stacked structure of a magnetic tunnel junction element according to Example 1.
Figure 21:
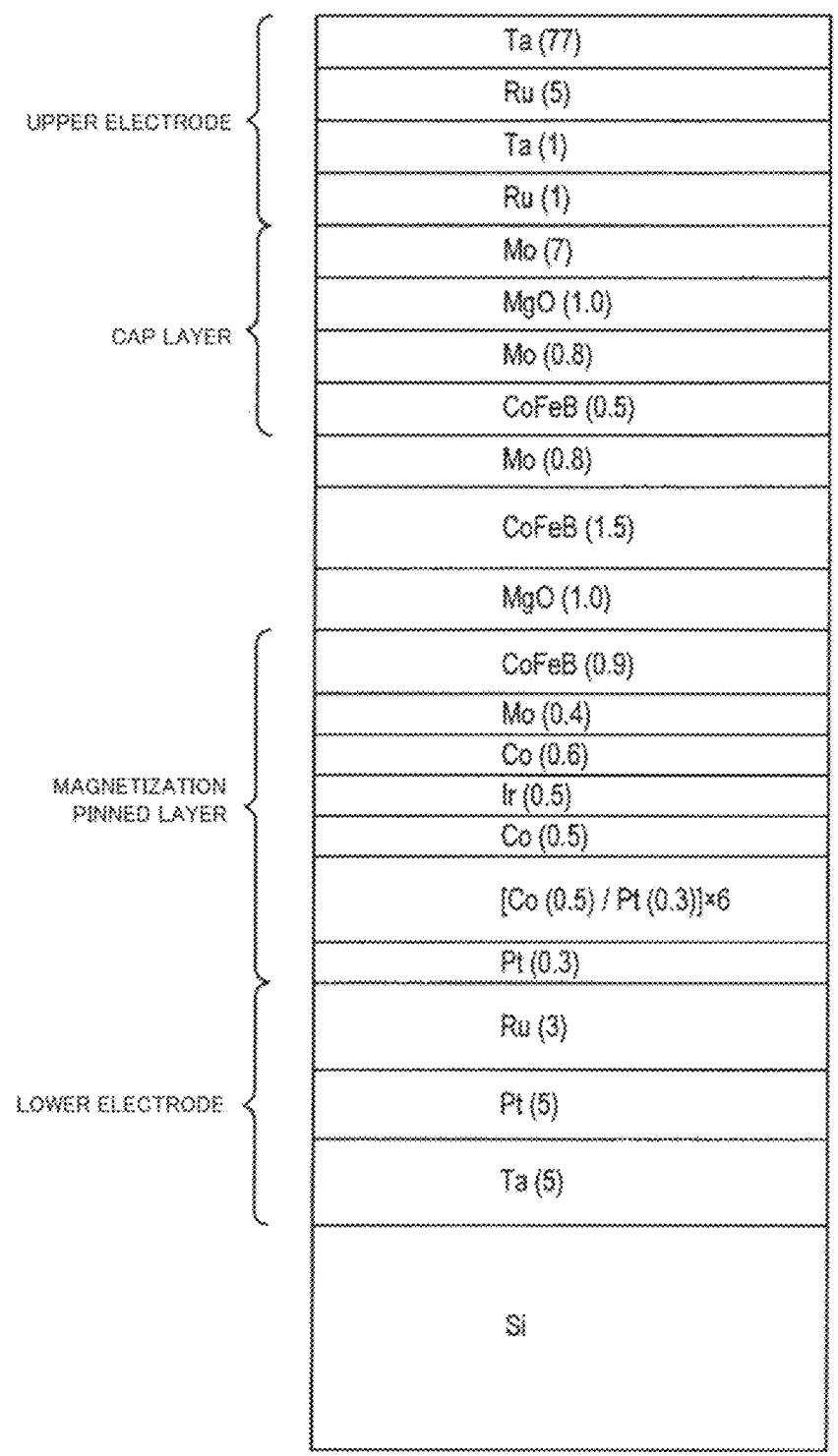
FIG. 21 is an explanatory diagram showing a stacked structure of a magnetic tunnel junction element according to Example 2.
Figure 22:
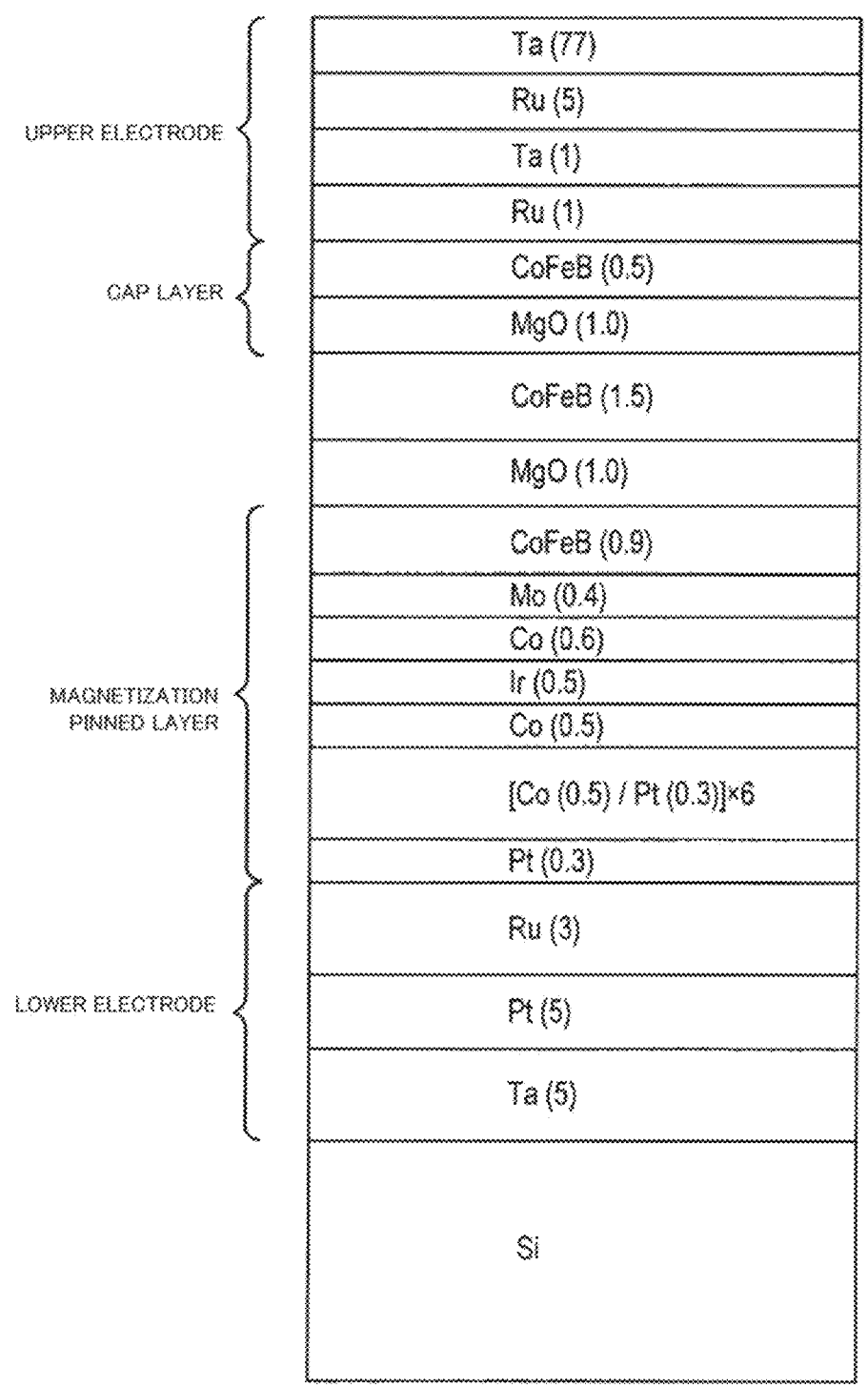
FIG. 22 is an explanatory diagram showing a stacked structure of a magnetic tunnel junction element according to Comparative Example 1.
Figure 23:
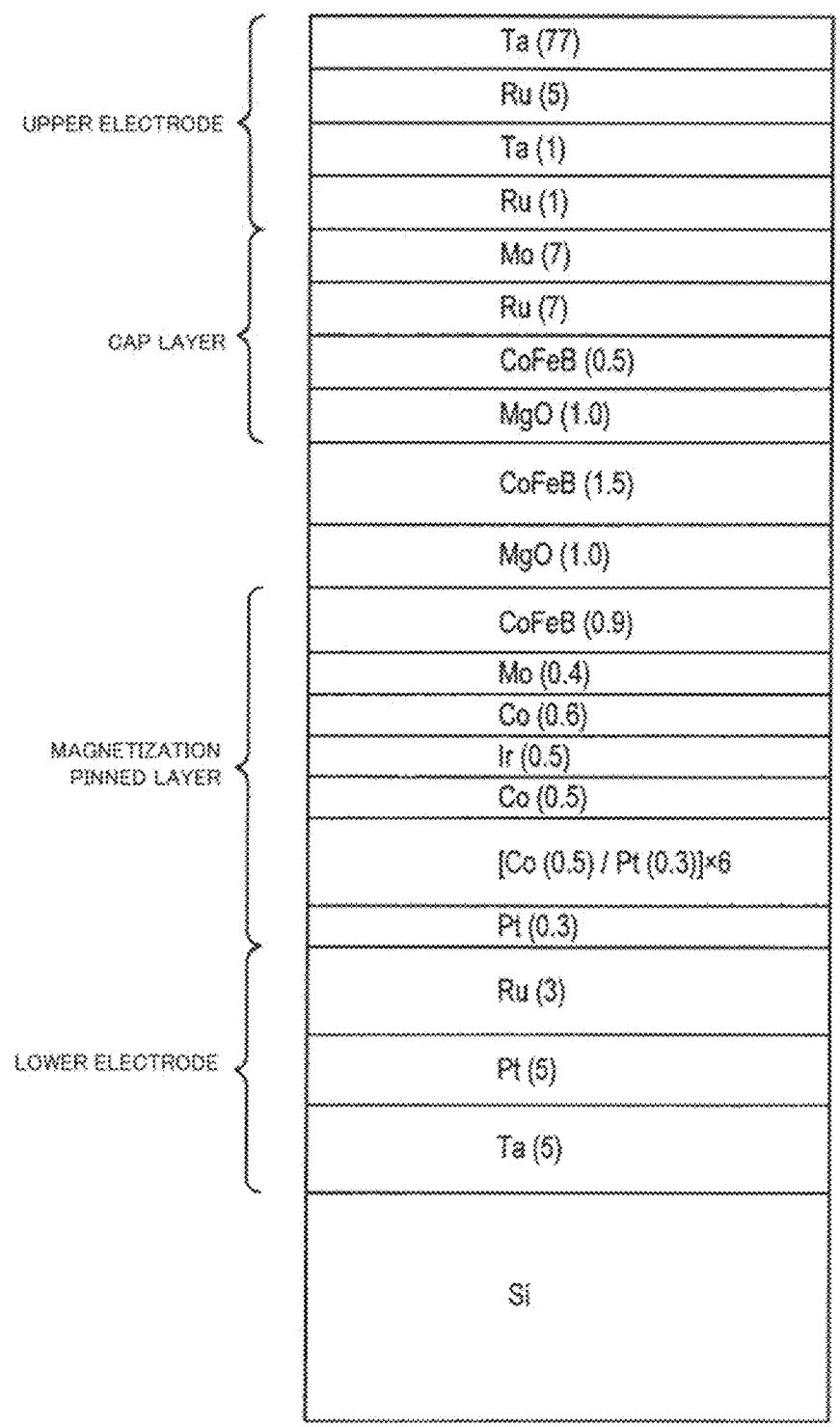
FIG. 23 is an explanatory diagram showing a stacked structure of a magnetic tunnel junction element according to Comparative Example 2.

First, in order to verify effects of the magnetic tunnel junction element according to the present embodiment, magnetic tunnel junction elements having stacked structures shown in FIGS. 20 to 23 were manufactured. FIG. 20 is an explanatory diagram showing a stacked structure of a magnetic tunnel junction element according to Example 1. FIG. 21 is an explanatory diagram showing a stacked structure of a magnetic tunnel junction element according to Example 2. FIG. 22 is an explanatory diagram showing a stacked structure of a magnetic tunnel junction element according to Comparative Example 1. FIG. 23 is an explanatory diagram showing a stacked structure of a magnetic tunnel junction element according to Comparative Example 2. Also, in FIGS. 20 to 23, numerical values in parentheses represent a film thickness of each layer in nanometer units.

As shown in FIG. 20, the magnetic tunnel junction element according to Example 1 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), an adjacent layer of Mo (0.8 nm), a cap layer configured of MgO (1.0 nm), Ru (7 nm), and Mo (7 nm), and an upper electrode configured of Ru (1 nm), Ta (1 nm), Ru (5 nm), and Ta (77 nm).

Also, as shown in FIG. 21, the magnetic tunnel junction element according to Example 2 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), an adjacent layer of Mo (0.8 nm), a cap layer configured of CoFeB (0.5 nm), Mo (0.8 nm), MgO (1.0 nm), and Mo (7 nm), and an upper electrode configured of Ru (1 nm), Ta (1 nm), Ru (5 nm), and Ta (77 nm).

Also, as shown in FIG. 22, the magnetic tunnel junction element according to Comparative Example 1 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), a cap layer configured of MgO (1.0 nm) and CoFeB (0.5 nm), and an upper electrode configured of Ru (1 nm), Ta (1 nm), Ru (5 nm), and Ta (77 nm).

Also, as shown in FIG. 23, the magnetic tunnel junction element according to Comparative Example 2 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), a cap layer configured of MgO (1.0 nm), CoFeB (0.5 nm), Ru (7 nm), and Mo (7 nm), and an upper electrode configured of Ru (1 nm), Ta (1 nm), Ru (5 nm), and Ta (77 nm).

Next, in each of a state in which the films were formed on the Si substrate, a state in which the element was processed into a cylindrical shape having a diameter of about 60 nm from the state in which the films were formed, and a state in which the element was further heat-treated at a high temperature for a long time after the processing, magnetism-resistance characteristics of the magnetic tunnel junction elements according to Examples 1 and 2 or Comparative Examples 1 and 2 were evaluated. Specifically, a M-H loop measurement was performed with a vibrating sample magnetometer (VSM), and a R-H loop measurement was performed with an automatic prober. The results are shown in FIGS. 24A to 27C.

Figure 24A:
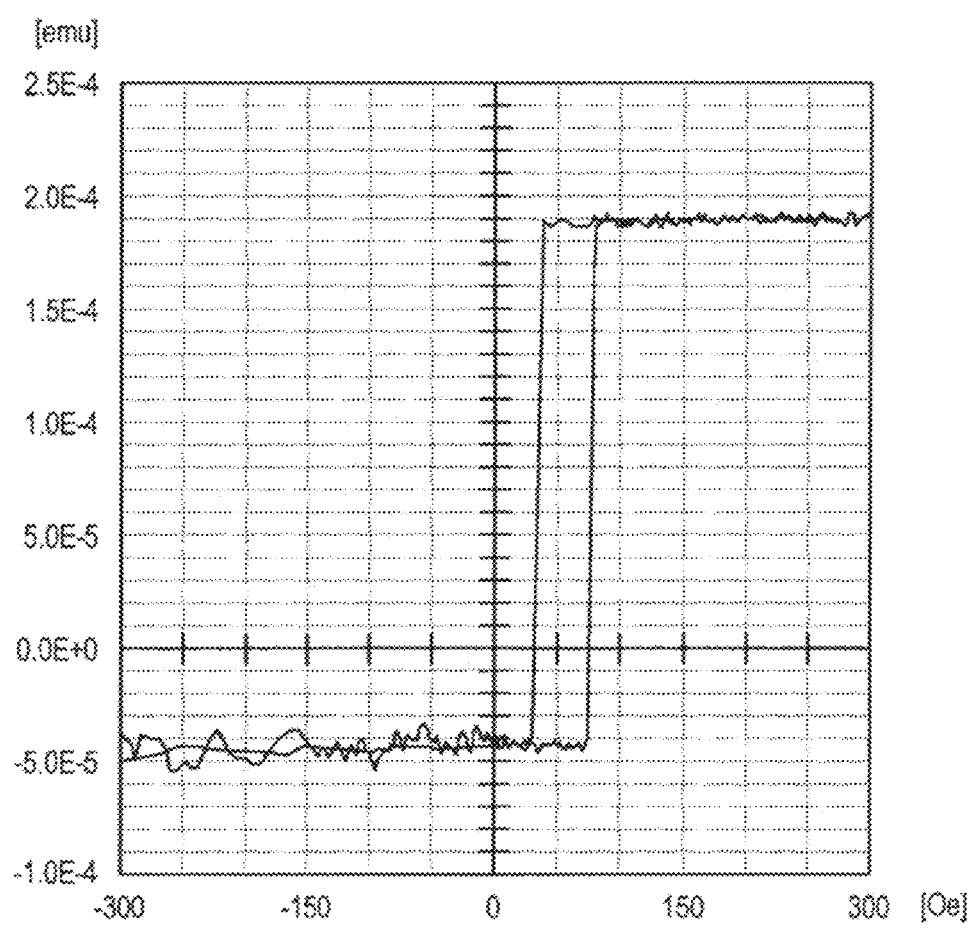
FIG. 24A is a graph showing evaluation results of magnetism-resistance characteristics of the magnetic tunnel junction element according to Example 1.
Figure 24B:
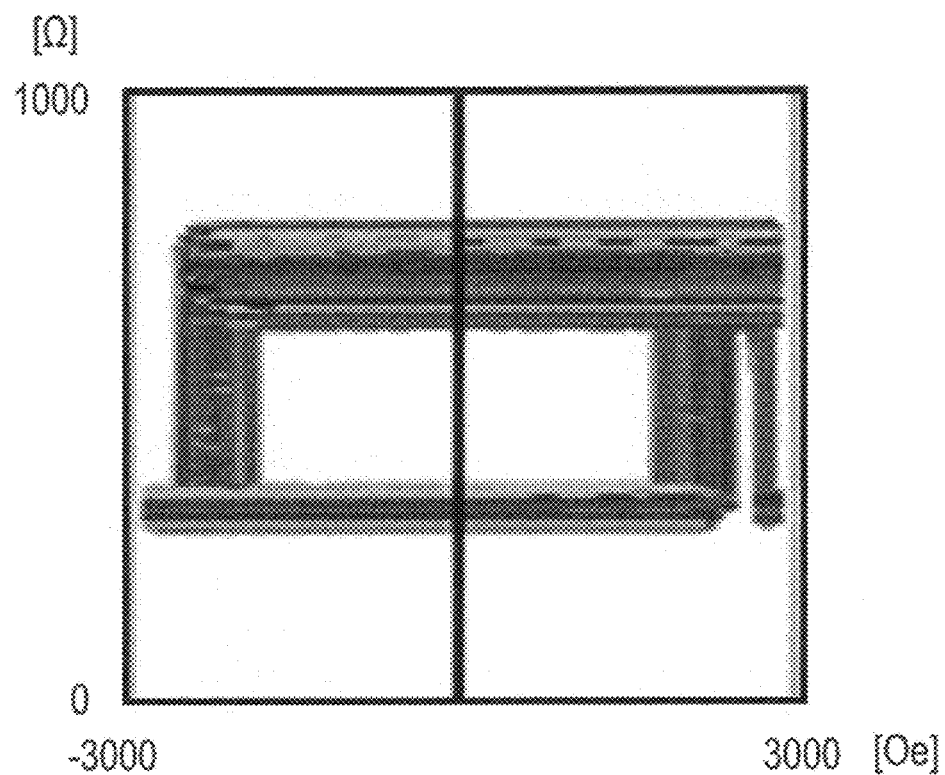
FIG. 24B is a graph showing evaluation results of magnetism-resistance characteristics of the magnetic tunnel junction element according to Example 1.
Figure 24C:
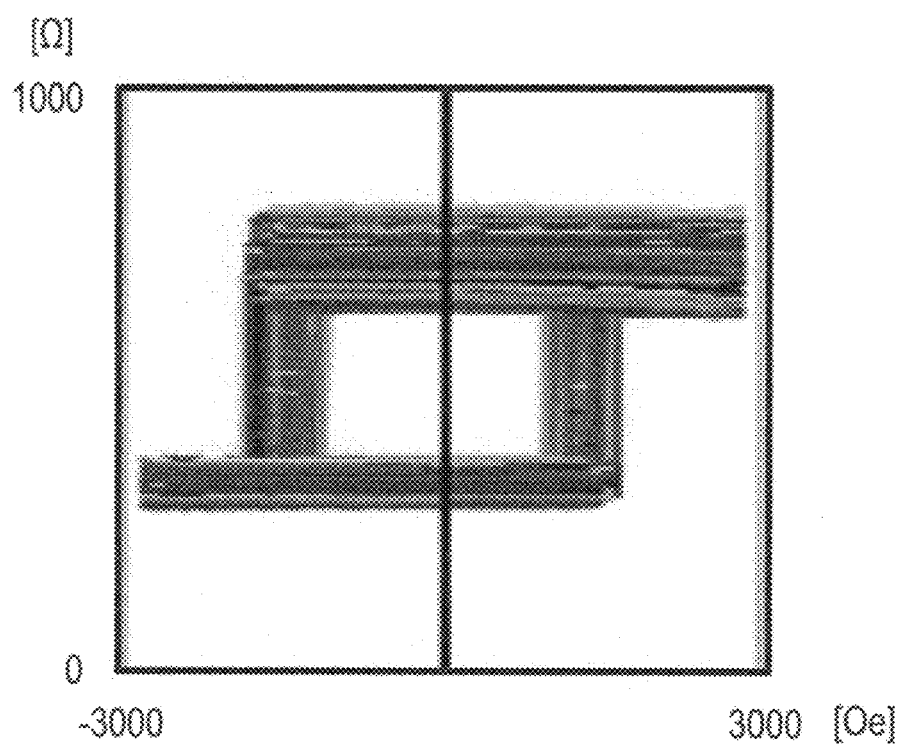
FIG. 24C is a graph showing evaluation results of magnetism-resistance characteristics of the magnetic tunnel junction element according to Example 1.
Figure 25A:
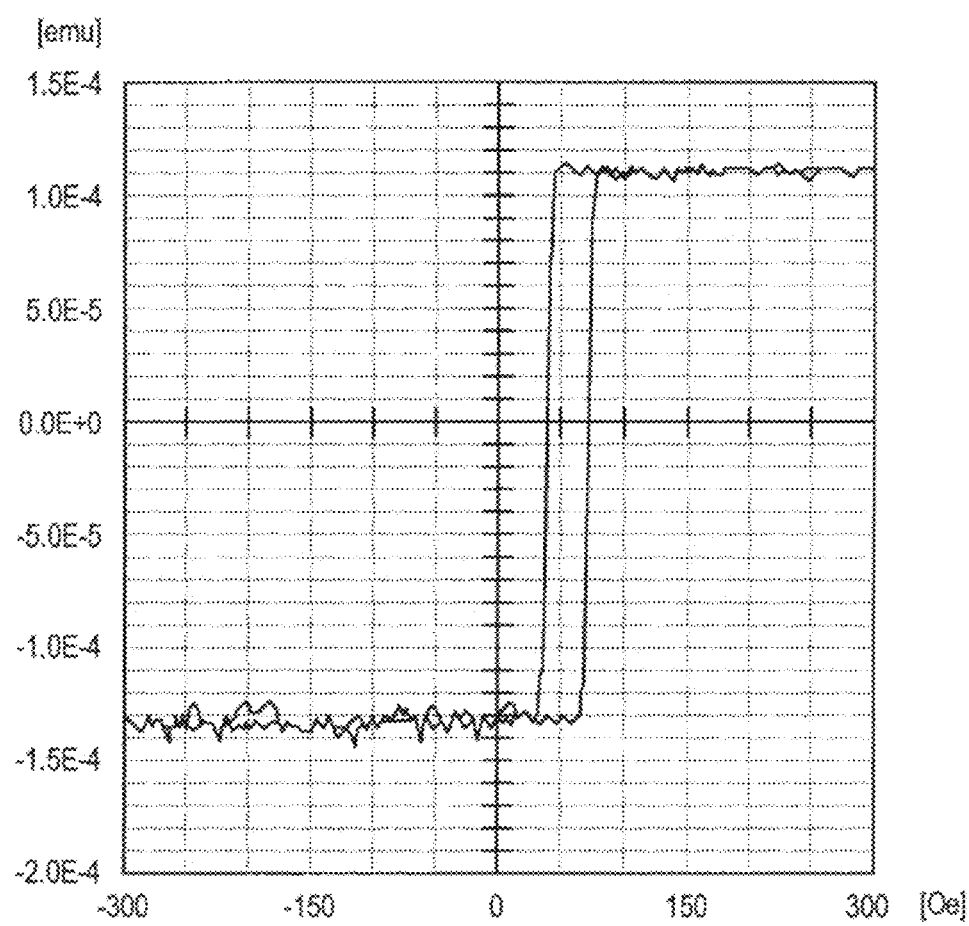
FIG. 25A is a graph showing evaluation results of magnetism-resistance characteristics of the magnetic tunnel junction element according to Example 2.
Figure 25B:
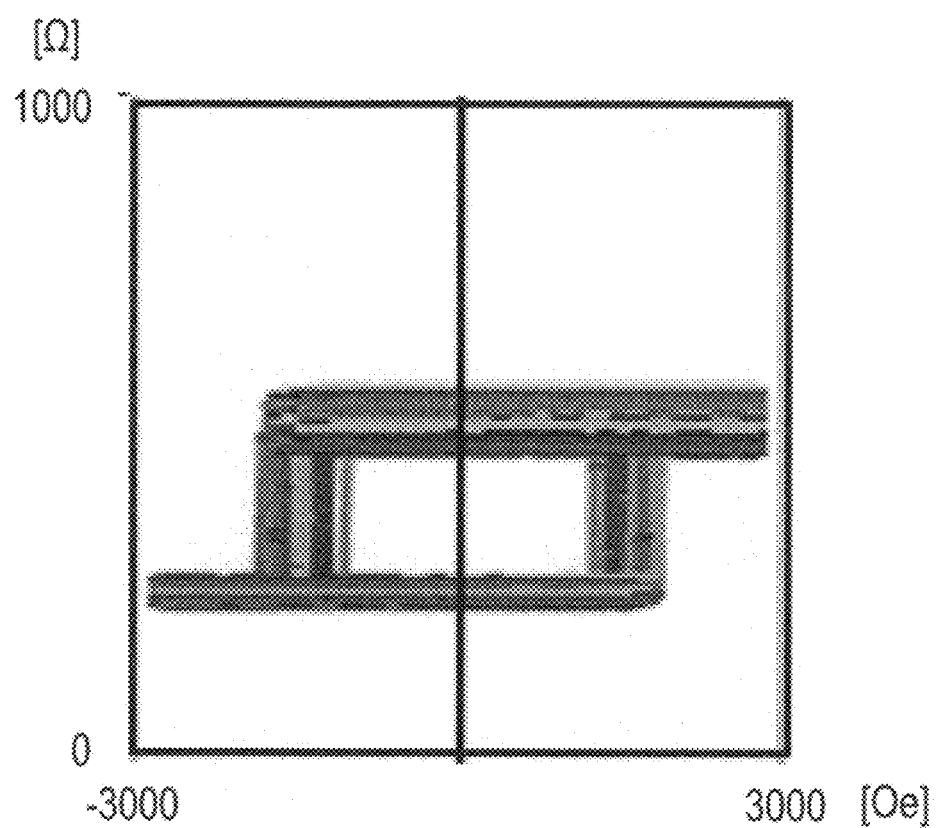
FIG. 25B is a graph showing evaluation results of magnetism-resistance characteristics of the magnetic tunnel junction element according to Example 2.
Figure 25C:
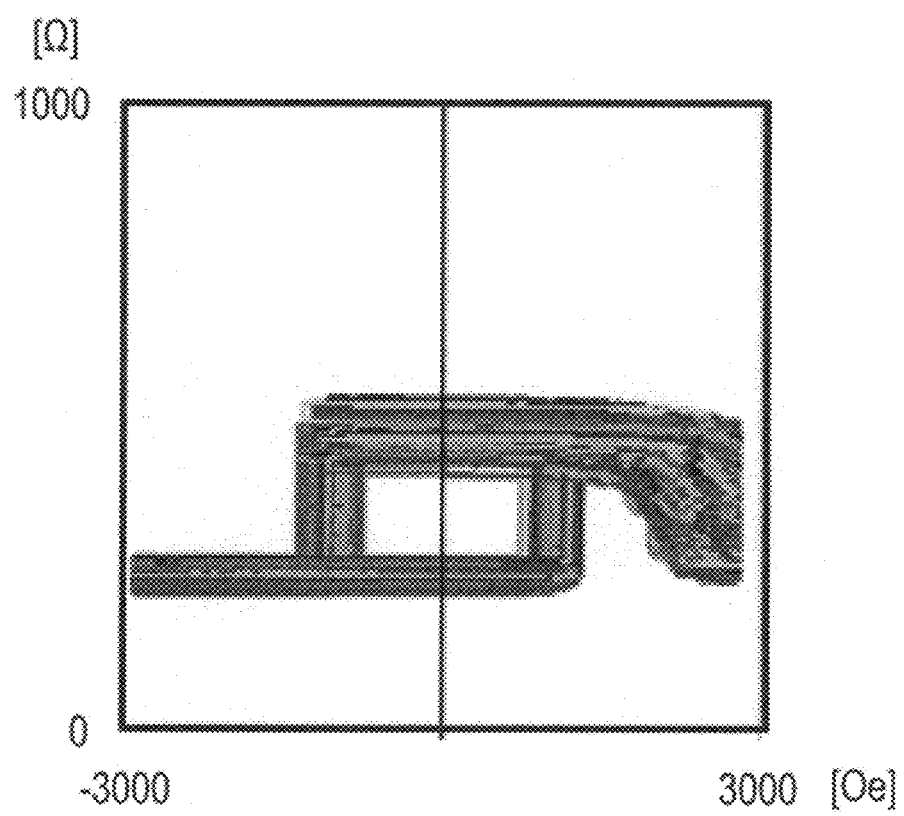
FIG. 25C is a graph showing evaluation results of magnetism-resistance characteristics of the magnetic tunnel junction element according to Example 2.
Figure 26A:
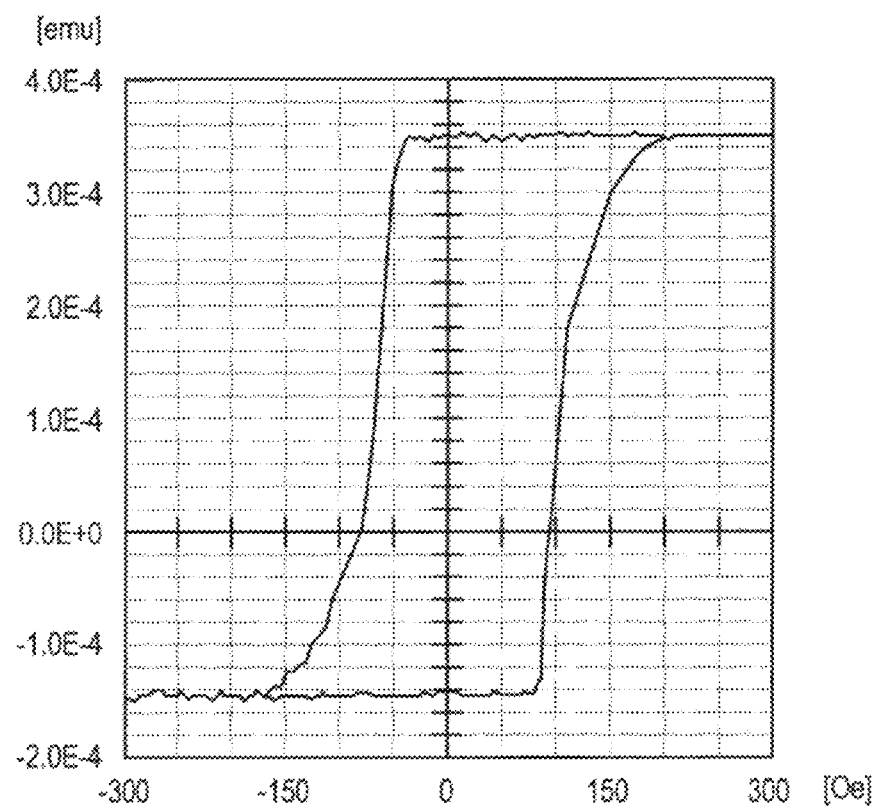
FIG. 26A is a graph showing evaluation results of magnetism-resistance characteristics of the magnetic tunnel junction element according to Comparative Example 1.
Figure 26B:
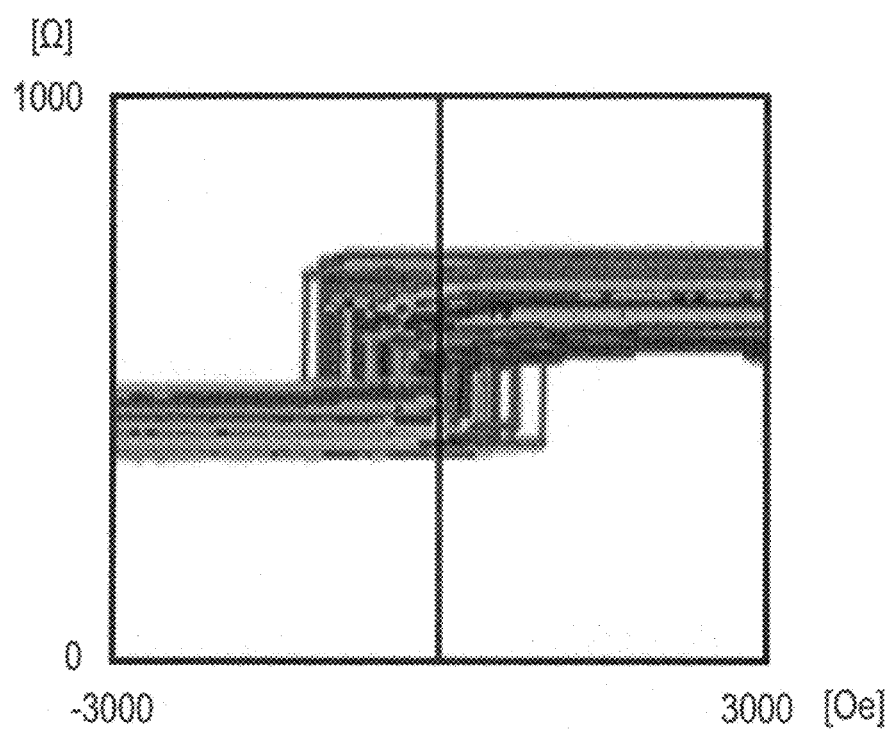
FIG. 26B is a graph showing evaluation results of magnetism-resistance characteristics of the magnetic tunnel junction element according to Comparative Example 1.
Figure 26C:
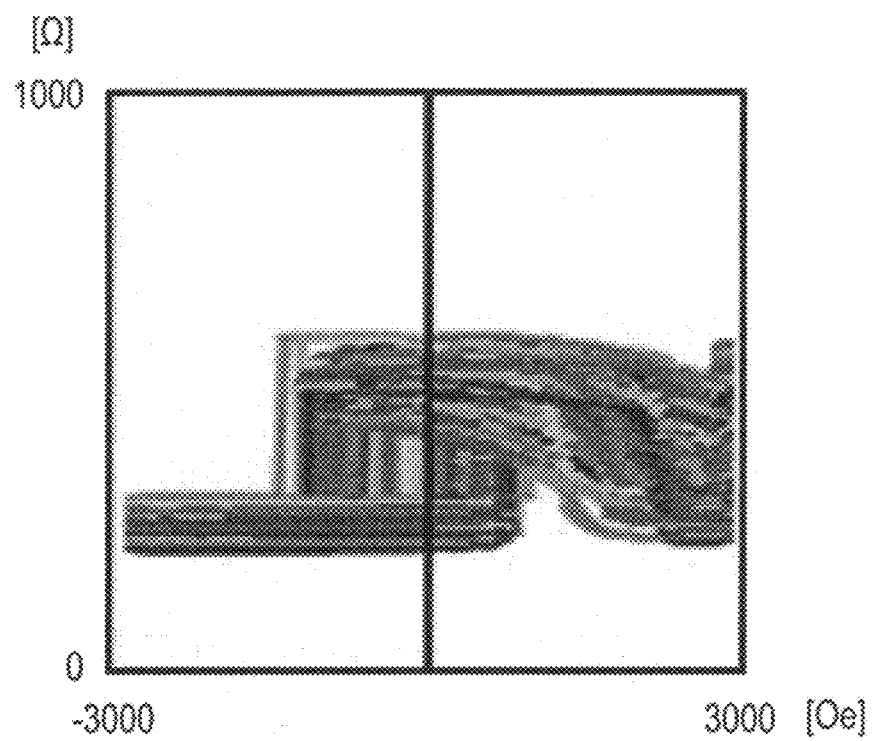
FIG. 26C is a graph showing evaluation results of magnetism-resistance characteristics of the magnetic tunnel junction element according to Comparative Example 1.
Figure 27A:
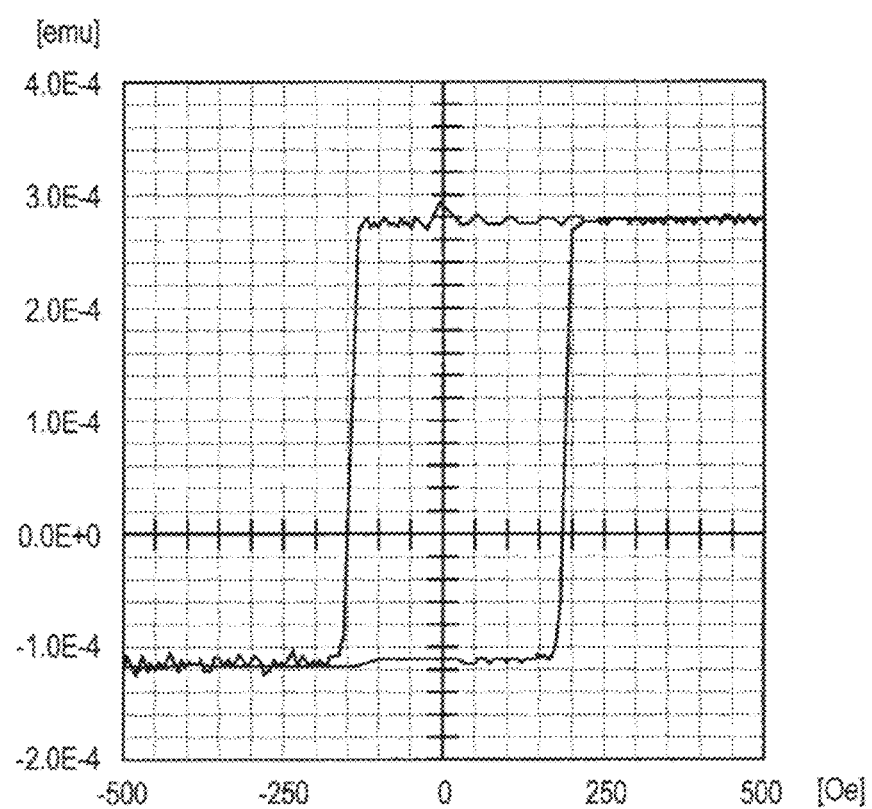
FIG. 27A is a graph showing evaluation results of magnetism-resistance characteristics of the magnetic tunnel junction element according to Comparative Example 2.
Figure 27B:
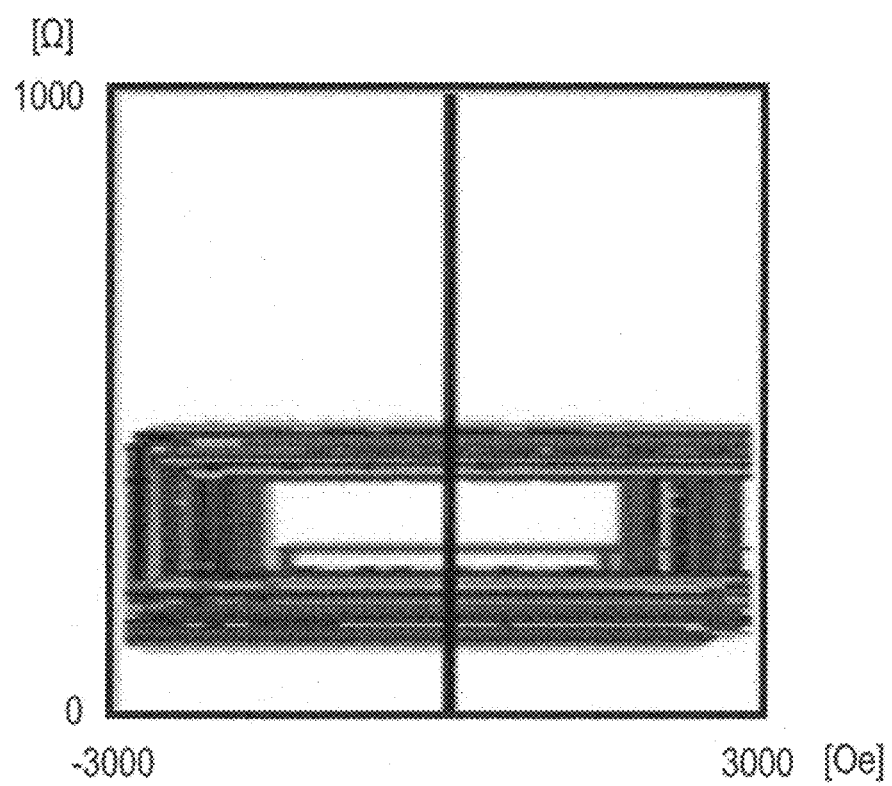
FIG. 27B is a graph showing evaluation results of magnetism-resistance characteristics of the magnetic tunnel junction element according to Comparative Example 2.
Figure 27C:
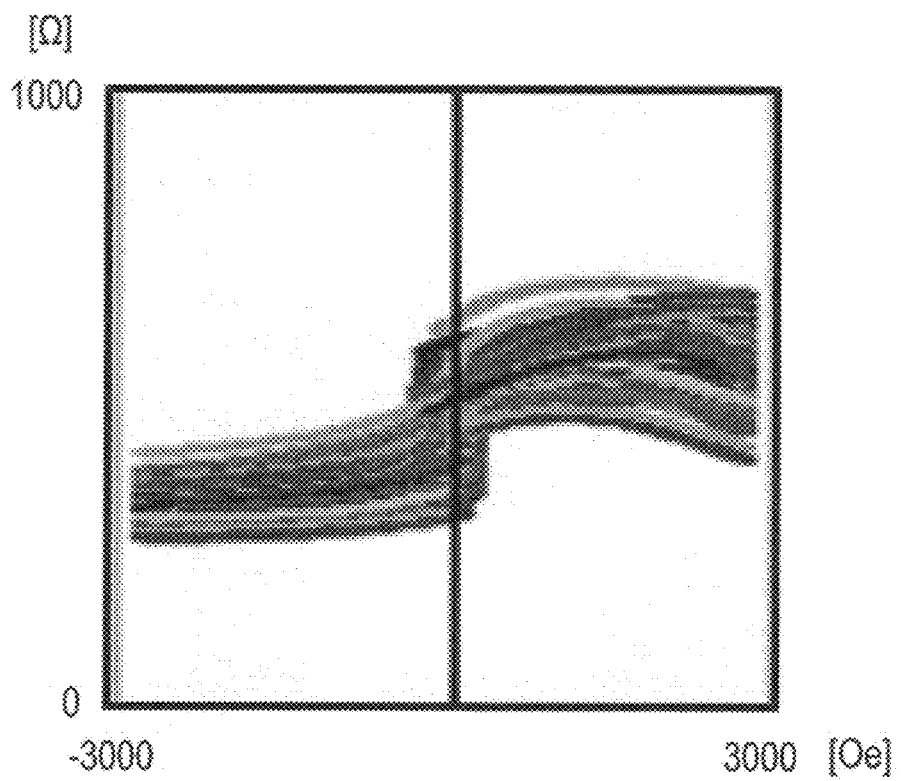
FIG. 27C is a graph showing evaluation results of magnetism-resistance characteristics of the magnetic tunnel junction element according to Comparative Example 2.

FIGS. 24A to 24C are graphs showing evaluation results of magnetism-resistance characteristics of the magnetic tunnel junction element according to Example 1. Also, FIGS. 25A to 25C are graphs showing evaluation results of magnetism-resistance characteristics of the magnetic tunnel junction element according to Example 2. Further, FIGS. 26A to 26C are graphs showing evaluation results of magnetism-resistance characteristics of the magnetic tunnel junction element according to Comparative Example 1. FIGS. 27A to 27C are graphs showing evaluation results of magnetism-resistance characteristics of the magnetic tunnel junction element according to Comparative Example 2.

Referring to FIGS. 24A to 24C, in the magnetic tunnel junction element according to Example 1, it can be seen that a rectangular hysteresis curve was formed in all of the states in which the films were formed on the Si substrate (FIG. 24A), the element has been processed (FIG. 24B), and the heat treatment was performed (FIG. 24C). Therefore, in Example 1, it can be seen that the magnetic tunnel junction element functions as an MTJ element even after the processing and the heat treatment, and the magnetization free layer retains the perpendicular magnetic anisotropy.

Referring to FIGS. 25A to 25C, in the magnetic tunnel junction element according to Example 2, it can be seen that a rectangular hysteresis curve was formed in all of the states in which the films were formed on the Si substrate (FIG. 25A), the element was processed (FIG. 25B), and the heat treatment was performed (FIG. 25C). Therefore, in Example 2, it can be seen that the magnetic tunnel junction element functions as an MTJ element even after the processing and the heat treatment, and the magnetization free layer retains the perpendicular magnetic anisotropy.

On the other hand, referring to FIGS. 26A to 26C, in the magnetic tunnel junction element according to Comparative Example 1, it can be seen that a rectangular hysteresis curve was formed in the state in which the films were formed the Si substrate (FIG. 26A), whereas hysteresis curves were not formed in the state in which the element was processed (FIG. 26B) and the state in which the heat treatment was performed (FIG. 26C). Therefore, in Comparative Example 1, it can be seen that although the magnetization free layer has the perpendicular magnetic anisotropy in the state in which the films are formed on the Si substrate, it loses the perpendicular magnetic anisotropy due to the processing, and thus the magnetic tunnel junction element after the processing does not function as an MTJ element.

Also, referring to FIGS. 27A to 27C, in the magnetic tunnel junction element according to Comparative Example 2, it can be seen that rectangular hysteresis curves were formed in the state in which the films were formed on the Si substrate (FIG. 27A) and the state in which the element was processed (FIG. 27B), whereas a hysteresis curve was not formed in the state in which the heat treatment was performed (FIG. 27C). Therefore, in Comparative Example 2, it can be seen that although the magnetization free layer has the perpendicular magnetic anisotropy in the state in which the films are formed on the Si substrate and in the state in which the element is processed, it loses the perpendicular magnetic anisotropy due to the heat treatment, and thus the magnetic tunnel junction element after the heat treatment does not function as an MTJ element.

Therefore, in the magnetic tunnel junction element according to the present embodiment, it can be seen that the adjacent layer formed of the non-magnetic transition metal is provided adjacent to the magnetization free layer and the barrier layer similarly formed of the non-magnetic transition metal is provided inside the cap layer, and thus the magnetic tunnel junction element functions as an MTJ element even after the processing and the heat treatment. That is, it can be seen that the magnetic tunnel junction element according to the present embodiment has improved resistance to the heat treatment.

<Examination of Film Thickness of Each Layer of Magnetic Tunnel Junction Element>

Next, the film thickness of each layer of the magnetic tunnel junction element according to the present embodiment was changed to measure the magnetic characteristics thereof. Specifically, the M-H loop measurement was performed with a vibrating sample magnetometer (VSM), and the R-H loop measurement was performed with an automatic prober. An MR characteristic measurement was performed with a CIPT (Current-In-Plane Tunneling) measuring device. The results are shown in FIGS. 30 to 34.

(Adjacent Layer)

Figure 30:
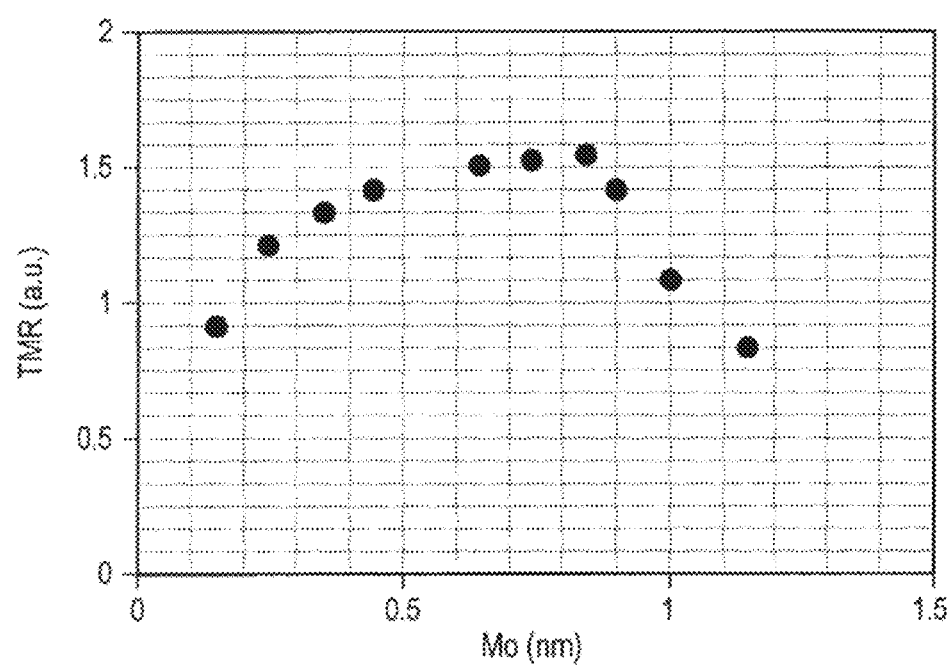
FIG. 30 is a graph showing a change of a TMR ratio of the magnetic tunnel junction element to a film thickness of an adjacent layer as a relative value.

First, FIG. 30 shows a change in the TMR ratio of the magnetic tunnel junction element when the film thickness of the adjacent layer of the magnetic tunnel junction element according to Example 1 is changed from 0.15 nm to 1.15 nm. FIG. 30 is a graph showing the change in the TMR ratio of the magnetic tunnel junction element with respect to the film thickness of the adjacent layer (Mo) as a relative value. Referring to FIG. 30, it can be seen that the TMR ratio of the magnetic tunnel junction element is further improved in a case in which the film thickness of the adjacent layer (Mo) is 0.1 nm or more and 1 nm or less.

(Barrier layer)

Figure 31:
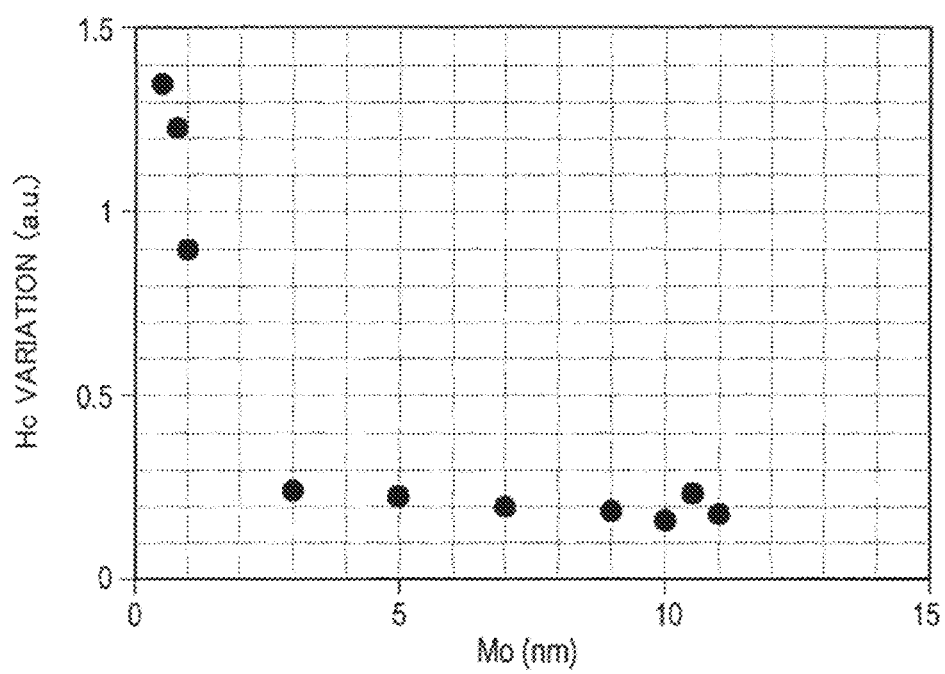
FIG. 31 is a graph showing a change in a coercive force variation of the magnetic tunnel junction element with respect to a film thickness of a barrier layer as a relative value.

Next, FIG. 31 shows a change in a coercive force (Hc) variation of the magnetic tunnel junction element when the film thickness of the barrier layer of the magnetic tunnel junction element according to Example 1 is changed from 0.5 nm to 11 nm. FIG. 31 is a graph showing the change in the coercive force (He) variation of the magnetic tunnel junction element with respect to the film thickness of the barrier layer (Mo) as a relative value. Referring to FIG. 31, it can be seen that the coercive force (Hc) variation of the magnetic tunnel junction element is further reduced in a case in which the film thickness of the barrier layer (Mo) is 1 nm or more. On the other hand, in a case in which the film thickness of the barrier layer is 10 nm or less, processing of the magnetic tunnel junction element becomes easier, and thus processing accuracy of the magnetic tunnel junction element can be improved.

(Intermediate Layer)

Figure 32:
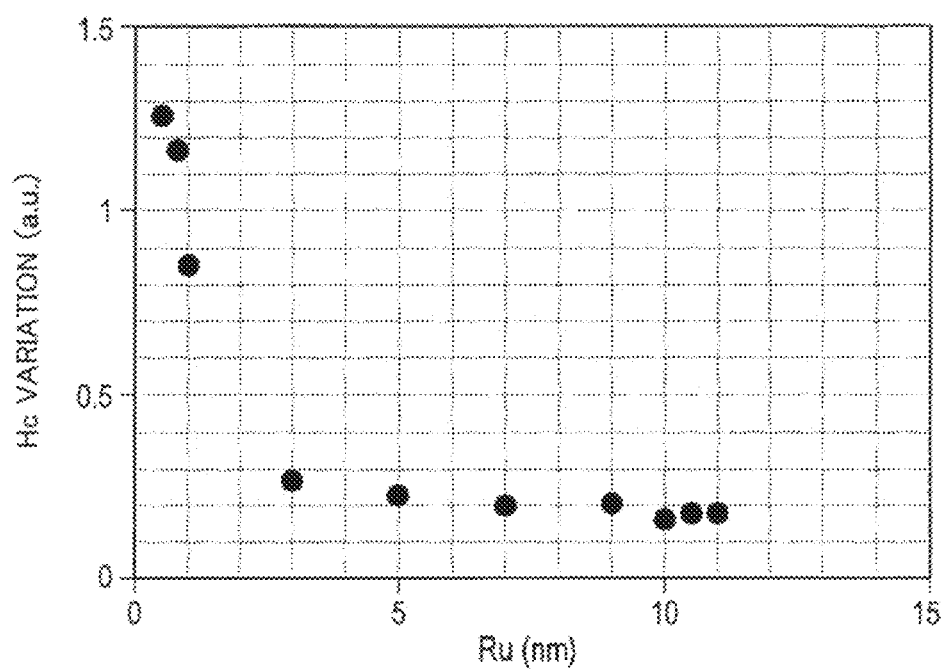
FIG. 32 is a graph showing a change in a coercive force variation of the magnetic tunnel junction element with respect to a film thickness of an intermediate layer as a relative value.

Next, FIG. 32 shows a change in the coercive force (Hc) variation of the magnetic tunnel junction element when the film thickness of the intermediate layer of the magnetic tunnel junction element according to Example 1 is changed from 0.5 nm to 11 nm. FIG. 32 is a graph showing the change in the coercive force (Hc) variation of the magnetic tunnel junction element with respect to the film thickness of the intermediate layer (Ru) as a relative value. Referring to FIG. 32, it can be seen that the coercive force (Hc) variation of the magnetic tunnel junction element is reduced in a case in which the film thickness of the intermediate layer is 1 nm or more. On the other hand, in a case in which the film thickness of the intermediate layer is 10 nm or less, processing of the magnetic tunnel junction element becomes easier, and thus processing accuracy of the magnetic tunnel junction element can be improved.

(Magnetic Layer)

Figure 28:
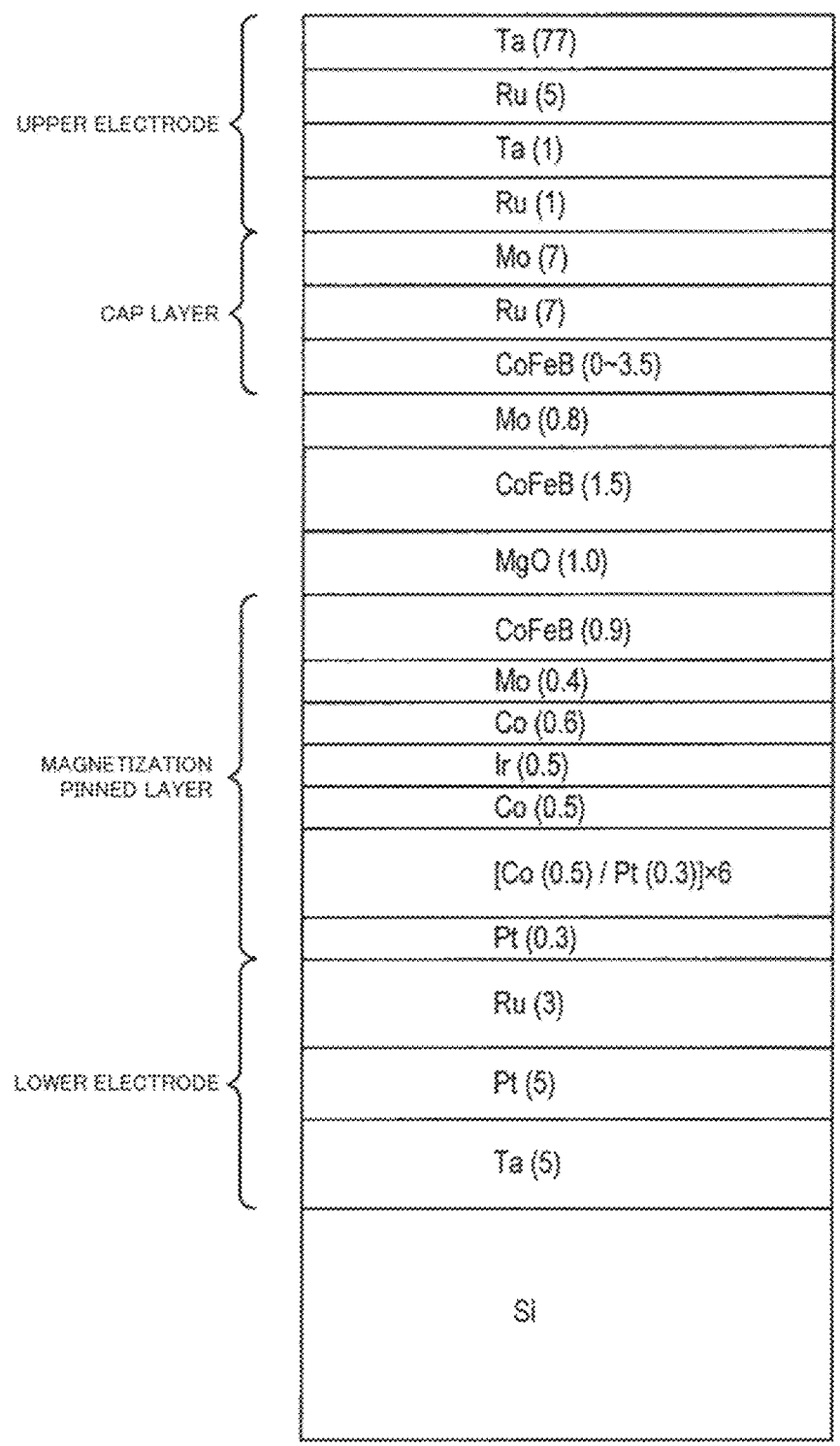
FIG. 28 is an explanatory diagram showing a stacked structure of a magnetic tunnel junction element according to Example 3.

Next, in order to examine the film thickness of the magnetic layer, a magnetic tunnel junction element having a stacked structure shown in FIG. 28 was manufactured. FIG. 28 is an explanatory diagram showing a stacked structure of a magnetic tunnel junction elements according to Example 3.

As shown in FIG. 28, the magnetic tunnel junction element according to Example 3 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), an adjacent layer of Mo (0.8 nm), a cap layer including a second insulating layer of MgO (1.0 nm), a magnetic layer of CoFeB (0 nm to 3.5 nm), an intermediate layer of Ru (7 nm), and a barrier layer of Mo (7 nm), and an upper electrode composed of Ru (1 nm), Ta (1 nm), Ru (5 nm), and Ta (77 nm).

Figure 33:
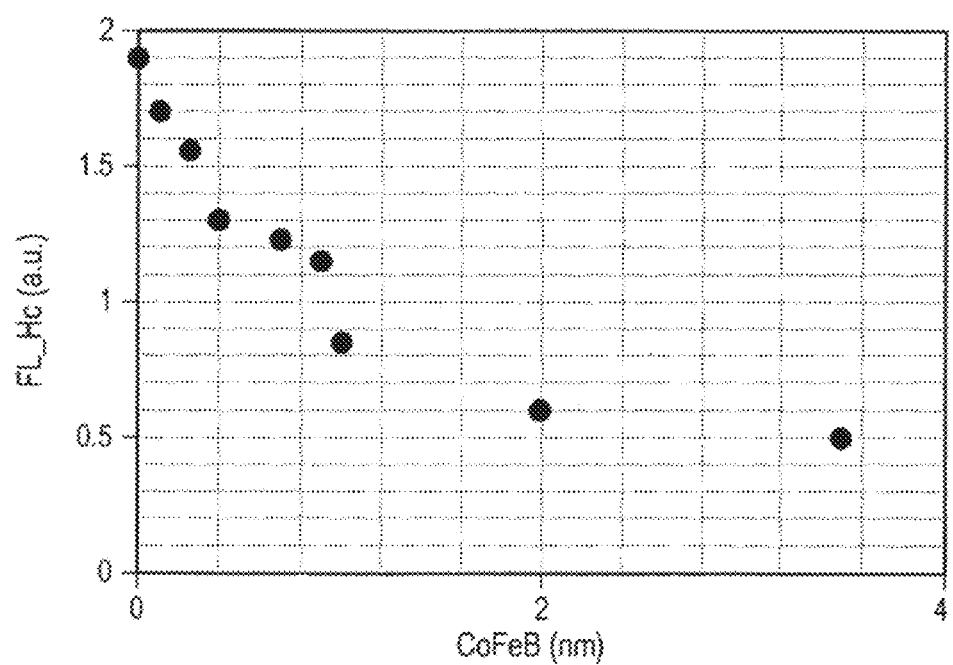
FIG. 33 is a graph showing a change in a coercive force of the magnetic tunnel junction element with respect to a film thickness of a magnetic layer as a relative value.

Here, FIG. 33 shows a change in a coercive force (Hc) of the magnetic tunnel junction element when a film thickness of the magnetic layer of the magnetic tunnel junction element according to Example 3 is changed from 0 nm to 3.5 nm. FIG. 33 is a graph showing the change in the coercive force (Hc) of the magnetic tunnel junction element with respect to the film thickness of the magnetic layer (CoFeB) as a relative value. Referring to FIG. 33, it can be seen that the coercive force (Hc) of the magnetic tunnel junction element is further increased in a case in which the film thickness of the magnetic layer (CoFeB) is 0.9 nm or less.

(Adjusting Layer)

Figure 29:
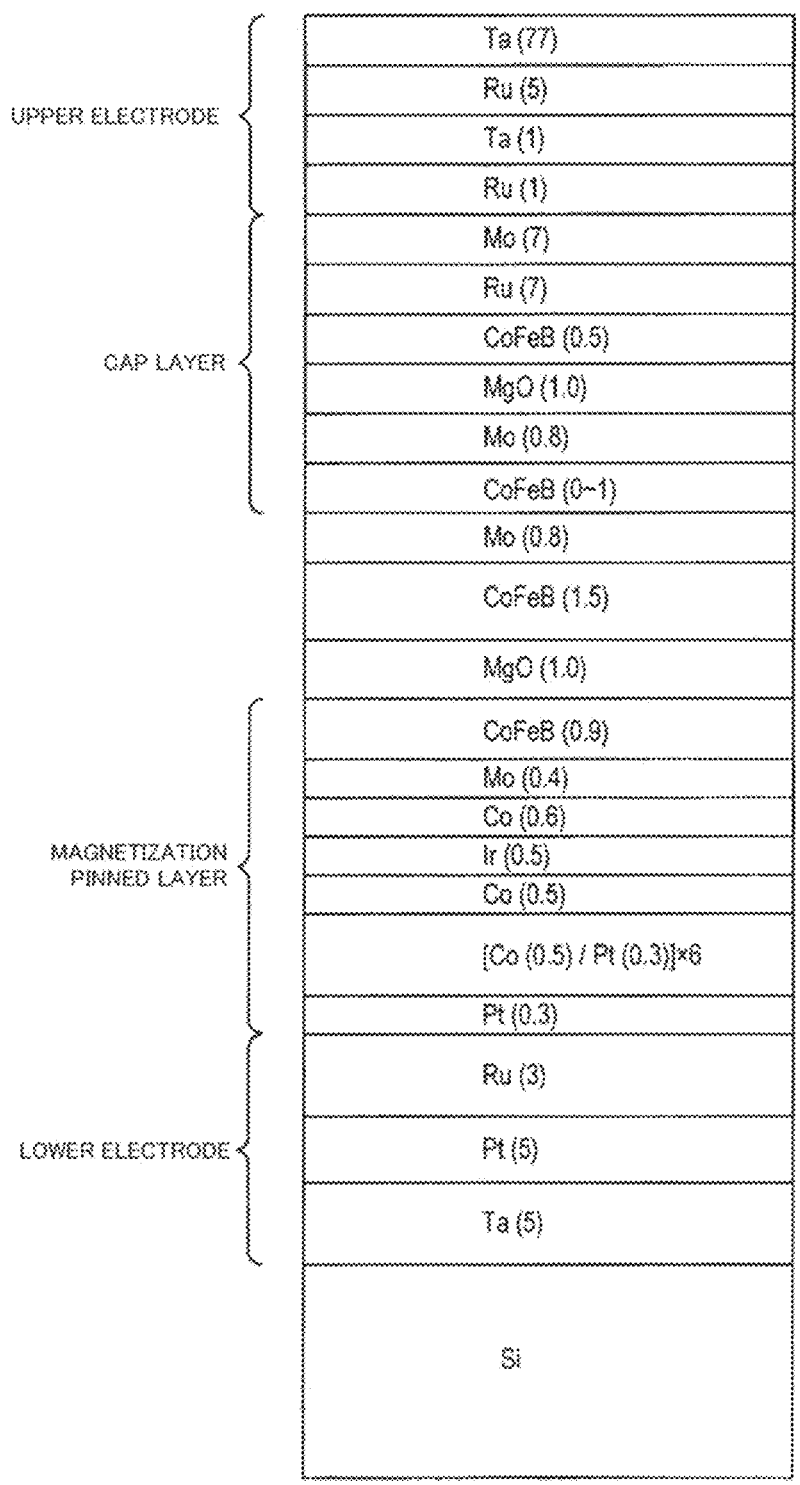
FIG. 29 is an explanatory diagram showing a stacked structure of a magnetic tunnel junction element according to Example 4.

Next, in order to examine the film thickness of the magnetic layer of the adjusting layer, a magnetic tunnel junction element having a stacked structure shown in FIG. 29 was manufactured. FIG. 29 is an explanatory diagram showing a stacked structure of a magnetic tunnel junction element according to Example 4.

As shown in FIG. 29, the magnetic tunnel junction element according to Example 4 was manufactured by stacking, on a Si substrate, a lower electrode configured of Ta (5 nm), Pt (5 nm), and Ru (3 nm), a structure in which Pt (0.3 nm), Co (0.5 nm), and Pt (0.3 nm) are stacked 6 times, a magnetization pinned layer configured of Co (0.5 nm), Ir (0.5 nm), Co (0.6 nm), Mo (0.4 nm), and CoFeB (0.9 nm), a first insulating layer of MgO (1.0 nm), a magnetization free layer of CoFeB (1.5 nm), an adjacent layer of Mo (0.8 nm), a cap layer including an adjusting layer of CoFeB (0 nm to 1 nm) and Mo (0.8 nm), a second insulating layer of MgO (1.0 nm), a magnetic layer of CoFeB (0.5 nm), an intermediate layer of Ru (7 nm), and a barrier layer of Mo (7 nm), and an upper electrode configured of Ru (1 nm), Ta (1 nm), Ru (5 nm), and Ta (77 nm).

Figure 34:
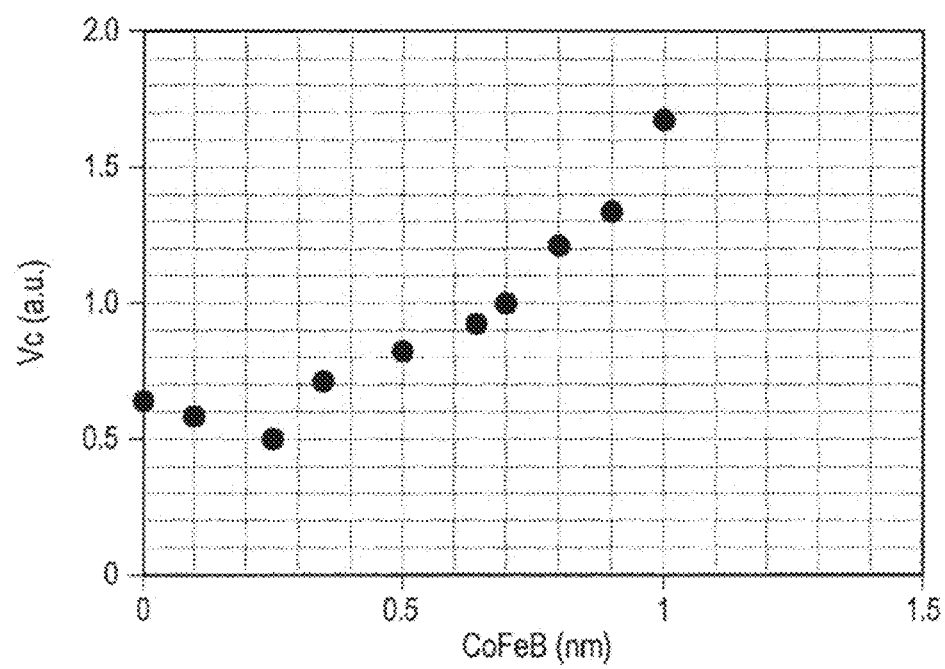
FIG. 34 is a graph showing a change in writing voltage of the magnetic tunnel junction element with respect to a film thickness of a magnetic layer in an adjusting layer as a relative value.

Here, FIG. 34 shows a change in the writing voltage (Vc) of the magnetic tunnel junction element when a film thickness of the magnetic layer in the adjusting layer of the magnetic tunnel junction element according to Example 4 is changed from 0 nm to 1 nm. FIG. 34 is a graph showing the change in the writing voltage (Vc) of the magnetic tunnel junction element with respect to the film thickness of the magnetic layer (CoFeB) in the adjusting layer as a relative value. Referring to FIG. 34, it can be seen that the writing voltage of the magnetic tunnel junction element can be further reduced in a case in which the film thickness of the magnetic layer (CoFeB) in the adjusting layer is 0.7 nm or less.

As described above, although the preferred embodiments of the present disclosure have been described in detail with reference to the accompanying figures, the technical scope of the present disclosure is not limited to such examples. It is clear that a person having ordinary knowledge in the technical field of the present disclosure could derive various changes or modifications within the scope of the technical idea described in the claims, and it is understood that these also naturally belong to the technical scope of the present disclosure.

For example, the magnetic tunnel junction elements 1 to 17 according to the above embodiments can be consolidated in various semiconductor devices together with transistors and the like. For example, the magnetic tunnel junction elements 1 to 17 may be consolidated in a semiconductor device such as a solid-state image pickup device, an arithmetic processing device, a communication device, or a storage device.

In addition, the effects described herein are merely explanatory or exemplary and are not intended as limiting. That is, the techniques according to the present disclosure may achieve other effects apparent to those skilled in the art from the description herein, in addition to or in place of the above effects.

Further, the following configurations also belong to the technical scope of the present disclosure.

(1)

A magnetic tunnel junction element including:

a magnetization pinned layer having a fixed magnetization direction;

a first insulating layer which is provided on the magnetization pinned layer and is formed of an insulating material;

a magnetization free layer provided on the first insulating layer;

an adjacent layer which is provided adjacent to the magnetization free layer and is formed of a non-magnetic transition metal; and a cap layer which is formed to have a multilayer structure including at least one barrier layer formed of the non-magnetic transition metal and is provided on the adjacent layer.

(2)

The magnetic tunnel junction element according to the above (1), further including an upper electrode provided on the cap layer, wherein a product of density and thermal conductivity of the non-magnetic transition metal is higher than a product of density and thermal conductivity of a metal material contained in the upper electrode.

(3)
The magnetic tunnel junction element according to the above (2),
wherein the upper electrode contains Ta or TaN, and the metal material contained in the upper electrode is Ta.

(4)
The magnetic tunnel junction element according to the above (1), wherein the non-magnetic transition metal is any one of Mo, W, Nb, Ir, Hf, and Ti.

(5)
The magnetic tunnel junction element according to any of the above (1) to (4), wherein the cap layer further includes a stacked structure in which a layer formed of the non-magnetic transition metal is stacked on a magnetic layer formed of a magnetic material containing a 3d transition metal and B, and the stacked structure is provided such that the magnetic layer is adjacent to the adjacent layer.

(6)
The magnetic tunnel junction element according to the above (5), wherein a film thickness of the magnetic layer of the stacked structure is 0.7 nm or less.

(7)
The magnetic tunnel junction element according to the above (5) or (6), wherein the magnetic material containing the 3d transition metal and B contains 15 atomic % or more of B.

(8)
The magnetic tunnel junction element according to any one of the above (1) to (7), wherein the cap layer further includes a second insulating layer formed of an insulating material.

(9)
The magnetic tunnel junction element according to the above (8), wherein the second insulating layer is provided on the adjacent layer.

(10)
The magnetic tunnel junction element according to the above (9), wherein the insulating material forming the first insulating layer and the second insulating layer is an inorganic oxide.

(11)
The magnetic tunnel junction element according to any one of the above (8) to (10), wherein the cap layer further includes a magnetic layer which is formed of a magnetic material containing a 3d transition metal and B and provided on the second insulating layer.

(12)
The magnetic tunnel junction element according to the above (11), wherein a film thickness of the magnetic layer provided on the second insulating layer is 0.9 nm or less.

(13)
The magnetic tunnel junction element according to the above (11) or (12), wherein the magnetic material containing the 3d transition metal and B contains 15 atomic % or more of B.

(14)
The magnetic tunnel junction element according to any one of the above (1) to (7), wherein each layer of the cap layer is made of a conductive material.

(15)
The magnetic tunnel junction element according to any one of the above (1) to (14), wherein a film thickness of the adjacent layer is 0.25 nm or more and 1 nm or less.

(16)
The magnetic tunnel junction element according to any one of the above (1) to (15), wherein a film thickness of the barrier layer is 1 nm or more and 10 nm or less.

(17)
The magnetic tunnel junction element according to any one of the above (1) to (16),
wherein the cap layer further includes an intermediate layer formed of a non-magnetic material, and
a film thickness of the intermediate layer is 1 nm or more and 10 nm or less.

(18)
The magnetic tunnel junction element according to any one of the above (1) to (17), wherein the magnetic tunnel junction element has a columnar shape or a cone shape.

(19)
A semiconductor device including a magnetic tunnel junction element, wherein the magnetic tunnel junction element includes:
a magnetization pinned layer having a fixed magnetization direction;
a first insulating layer which is provided on the magnetization pinned layer and is formed of an insulating material;
a magnetization free layer provided on the first insulating layer;
an adjacent layer which is provided adjacent to the magnetization free layer and is formed of a non-magnetic transition metal; and
a cap layer which is formed to have a multilayer structure including at least one barrier layer formed of the non-magnetic transition metal and is provided on the adjacent layer.

REFERENCE SIGNS LIST 1, 2, 3, 4, 5, 6, 7, 8, 9, 10, 11, 12, 13, 14, 15, 16, 17 Magnetic tunnel junction element
100 Substrate
110 Lower electrode
120 Magnetization pinned layer
130 First insulating layer
140 Magnetization free layer
150 Adjacent layer
160 Cap layer
161 Second insulating layer
162 Intermediate layer
163 Barrier layer
164 Magnetic layer
165 Adjusting layer
170 Upper electrode
180 Protective film

The invention claimed is:
1. A magnetic tunnel junction element, comprising:
a magnetization pinned layer having a fixed magnetization direction;
a first insulating layer which is provided on the magnetization pinned layer and is formed of an insulating material;
a magnetization free layer provided on the first insulating layer;
an adjacent layer which is provided adjacent to the magnetization free layer and is formed of a non-magnetic transition metal;
a cap layer which is formed to have a multilayer structure including at least one barrier layer formed of the non-magnetic transition metal and is provided on the adjacent layer; and
an upper electrode provided on the cap layer,
wherein a product of density and thermal conductivity of the non-magnetic transition metal is higher than a product of density and thermal conductivity of a metal material contained in the upper electrode, wherein the upper electrode contains Ta or TaN, and wherein the metal material contained in the upper electrode is Ta.

2. The magnetic tunnel junction element according to claim 1, wherein the non-magnetic transition metal is any one of Mo, W, Nb, Ir, Hf, and Ti.

3. The magnetic tunnel junction element according to claim 1, wherein the cap layer further includes a second insulating layer formed of an insulating material.

4. The magnetic tunnel junction element according to claim 3, wherein the second insulating layer is provided on the adjacent layer.

5. The magnetic tunnel junction element according to claim 4, wherein the insulating material forming the first insulating layer and the second insulating layer is an inorganic oxide.

6. The magnetic tunnel junction element according to claim 1, wherein each layer of the cap layer is made of a conductive material.

7. The magnetic tunnel junction element according to claim 1, wherein a film thickness of the adjacent layer is 0.25 nm or more and 1 nm or less.

8. The magnetic tunnel junction element according to claim 1, wherein a film thickness of the barrier layer is 1 nm or more and 10 nm or less.

9. The magnetic tunnel junction element according to claim 1, wherein the cap layer further includes an intermediate layer formed of a non-magnetic material, and a film thickness of the intermediate layer is 1 nm or more and 10 nm or less.

10. The magnetic tunnel junction element according to claim 1, wherein the magnetic tunnel junction element has a columnar shape or a cone shape.

11. A magnetic tunnel junction element, comprising:

a magnetization pinned layer having a fixed magnetization direction;

a first insulating layer which is provided on the magnetization pinned layer and is formed of an insulating material;

a magnetization free layer provided on the first insulating layer;

an adjacent layer which is provided adjacent to the magnetization free layer and is formed of a non-magnetic transition metal; and a cap layer which is formed to have a multilayer structure including at least one barrier layer formed of the non-magnetic transition metal and is provided on the adjacent layer, wherein the cap layer further includes a stacked structure in which a layer formed of the non-magnetic transition metal is stacked on a magnetic layer formed of a magnetic material containing a 3d transition metal and B, and wherein the stacked structure is provided such that the magnetic layer is adjacent to the adjacent layer.

12. The magnetic tunnel junction element according to claim 11, further comprising an upper electrode provided on the cap layer, wherein a product of density and thermal conductivity of the non-magnetic transition metal is higher than a product of density and thermal conductivity of a metal material contained in the upper electrode.

13. The magnetic tunnel junction element according to claim 11, wherein a film thickness of the magnetic layer of the stacked structure is 0.7 nm or less.

14. The magnetic tunnel junction element according to claim 11, wherein the magnetic material containing the 3d transition metal and B contains 15 atomic % or more of B.

15. A magnetic tunnel junction element, comprising:

a magnetization pinned layer having a fixed magnetization direction;

a first insulating layer which is provided on the magnetization pinned layer and is formed of an insulating material;

a magnetization free layer provided on the first insulating layer;

an adjacent layer which is provided adjacent to the magnetization free layer and is formed of a non-magnetic transition metal; and a cap layer which is formed to have a multilayer structure including at least one barrier layer formed of the non-magnetic transition metal and is provided on the adjacent layer, wherein the cap layer further includes a second insulating layer formed of an insulating material, and wherein the cap layer further includes a magnetic layer which is formed of a magnetic material containing a 3d transition metal and B and provided on the second insulating layer.

16. The magnetic tunnel junction element according to claim 15, wherein a film thickness of the magnetic layer provided on the second insulating layer is 0.9 nm or less.

17. The magnetic tunnel junction element according to claim 15, wherein the magnetic material containing the 3d transition metal and B contains 15 atomic % or more of B.

18. The magnetic tunnel junction element according to claim 15, further comprising an upper electrode provided on the cap layer, wherein a product of density and thermal conductivity of the non-magnetic transition metal is higher than a product of density and thermal conductivity of a metal material contained in the upper electrode.

19. The magnetic tunnel junction element according to claim 18, wherein the upper electrode contains Ta or TaN, and wherein the metal material contained in the upper electrode is Ta.

20. The magnetic tunnel junction element according to claim 15, wherein the non-magnetic transition metal is any one of Mo, W, Nb, Ir, Hf, and Ti.

* * * * *